United States Patent [19]

Korman et al.

[11] Patent Number: 5,234,851

[45] Date of Patent: Aug. 10, 1993

[54] SMALL CELL, LOW CONTACT ASSISTANCE RUGGED POWER FIELD EFFECT DEVICES AND METHOD OF FABRICATION

[75] Inventors: Charles S. Korman; Krishna Shenai, both of Schenectady, N.Y.

[73] Assignee: General Electric Company, Schenectady, N.Y.

[21] Appl. No.: 829,667

[22] Filed: Feb. 3, 1992

Related U.S. Application Data

[60] Division of Ser. No. 588,515, Sep. 24, 1990, Pat. No. 5,119,153, which is a continuation of Ser. No. 403,420, Sep. 5, 1989, abandoned.

[51] Int. Cl.$^5$ .......................................... H01L 21/265
[52] U.S. Cl. ..................................... 437/44; 437/49; 257/24
[58] Field of Search ................. 437/49, 44; 357/23.4

[56] References Cited

U.S. PATENT DOCUMENTS

| | | | |
|---|---|---|---|
| 4,714,951 | 12/1987 | Baudrant et al. | 357/23.15 |
| 4,725,872 | 2/1988 | Blouke et al. | 357/24 |
| 4,831,424 | 5/1989 | Yoshida et al. | 357/12.13 |
| 4,837,606 | 6/1989 | Goodman et al. | 357/23.4 |
| 4,857,983 | 8/1989 | Baliga et al. | 357/38 |
| 4,879,254 | 11/1989 | Tsuzuki et al. | 437/44 |
| 4,883,767 | 11/1989 | Gray et al. | 437/41 |
| 4,972,240 | 11/1990 | Murakami et al. | 357/23.4 |
| 4,985,740 | 1/1991 | Shenai et al. | 357/23.4 |
| 4,998,151 | 3/1991 | Korman et al. | 357/23.4 |
| 5,021,353 | 6/1991 | Lowrey et al. | 437/44 |
| 5,030,582 | 7/1991 | Miyajima et al. | 437/44 |
| 5,082,794 | 1/1992 | Pfiester et al. | 437/44 |
| 5,098,855 | 3/1992 | Komori et al. | 437/44 |

FOREIGN PATENT DOCUMENTS

| | | | |
|---|---|---|---|
| 0336393 | 10/1989 | European Pat. Off. | 357/23.4 |
| 0255276 | 10/1989 | Japan | 357/23.4 |

OTHER PUBLICATIONS

F. Sequeda, "The Role of Thin Film Materials on the Technology of Integrated Circuit Fabrication", Journal of Metals, Nov. 1985, pp. 54–59.

C. Y. Ting, "Silicide for Contacts and Interconnects", IBM Thomas J. Watson Research Center, Yorktown Heights, N.Y., IEDM, 1984, pp. 110–113.

C. J. Kircher et al., "Interconnection Method for Integrated Circuits", IBM Technical Disclosure Bulletin, vol. 13, No. 2, Jul. 1970, p. 436.

*Primary Examiner*—Olik Chaudhuri
*Assistant Examiner*—Long Pham
*Attorney, Agent, or Firm*—Marvin Snyder

[57] ABSTRACT

A multi-cellular power field effect semiconductor device has compact cells including a heavily doped portion of a body region which is self-aligned with respect to an aperture in the gate electrode. The intercept of this heavily doped portion of the body region with the upper surface of the device may also be self-aligned with respect to the aperture and the gate electrode. A method of producing the device is also disclosed.

3 Claims, 19 Drawing Sheets

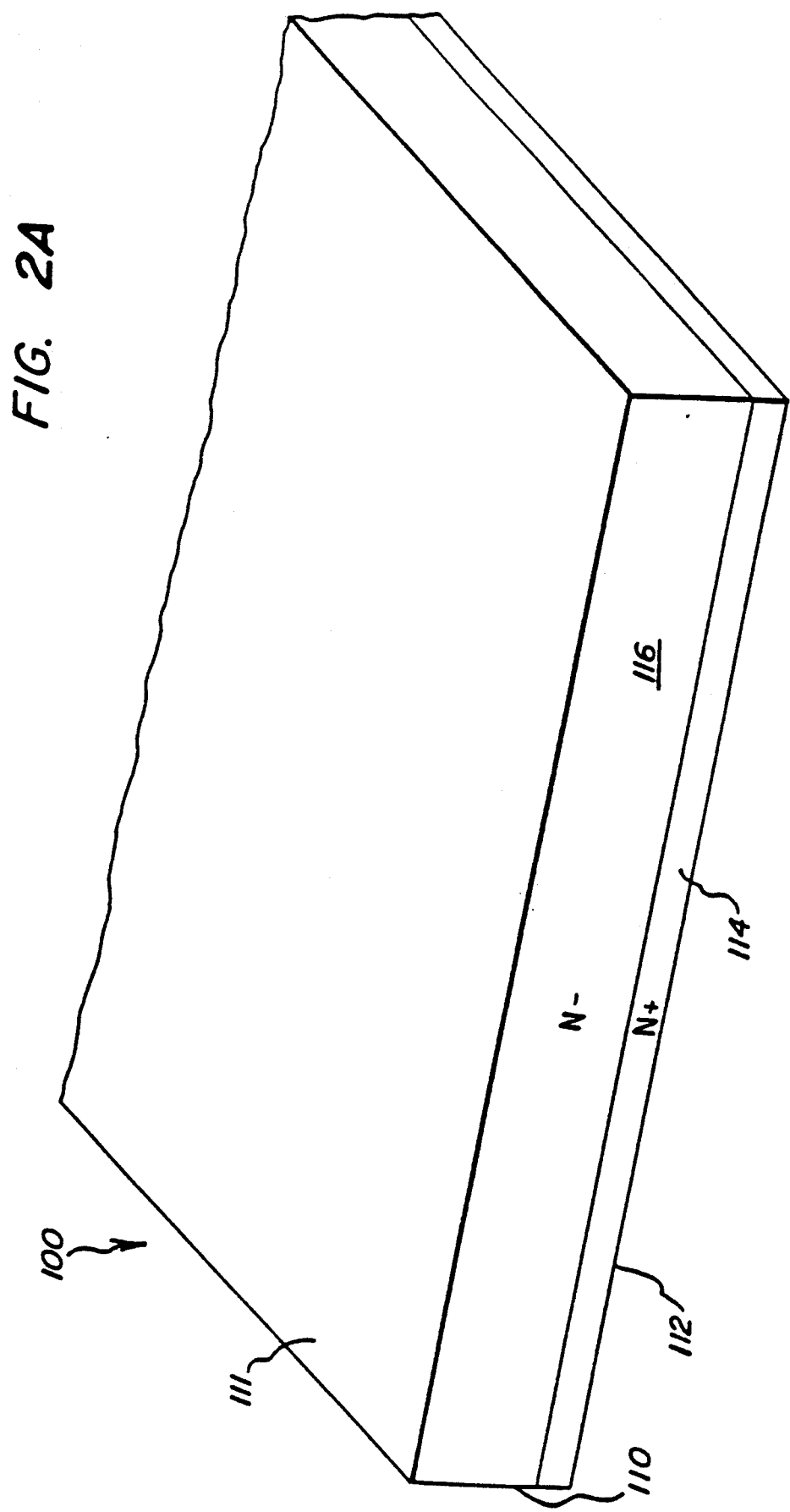

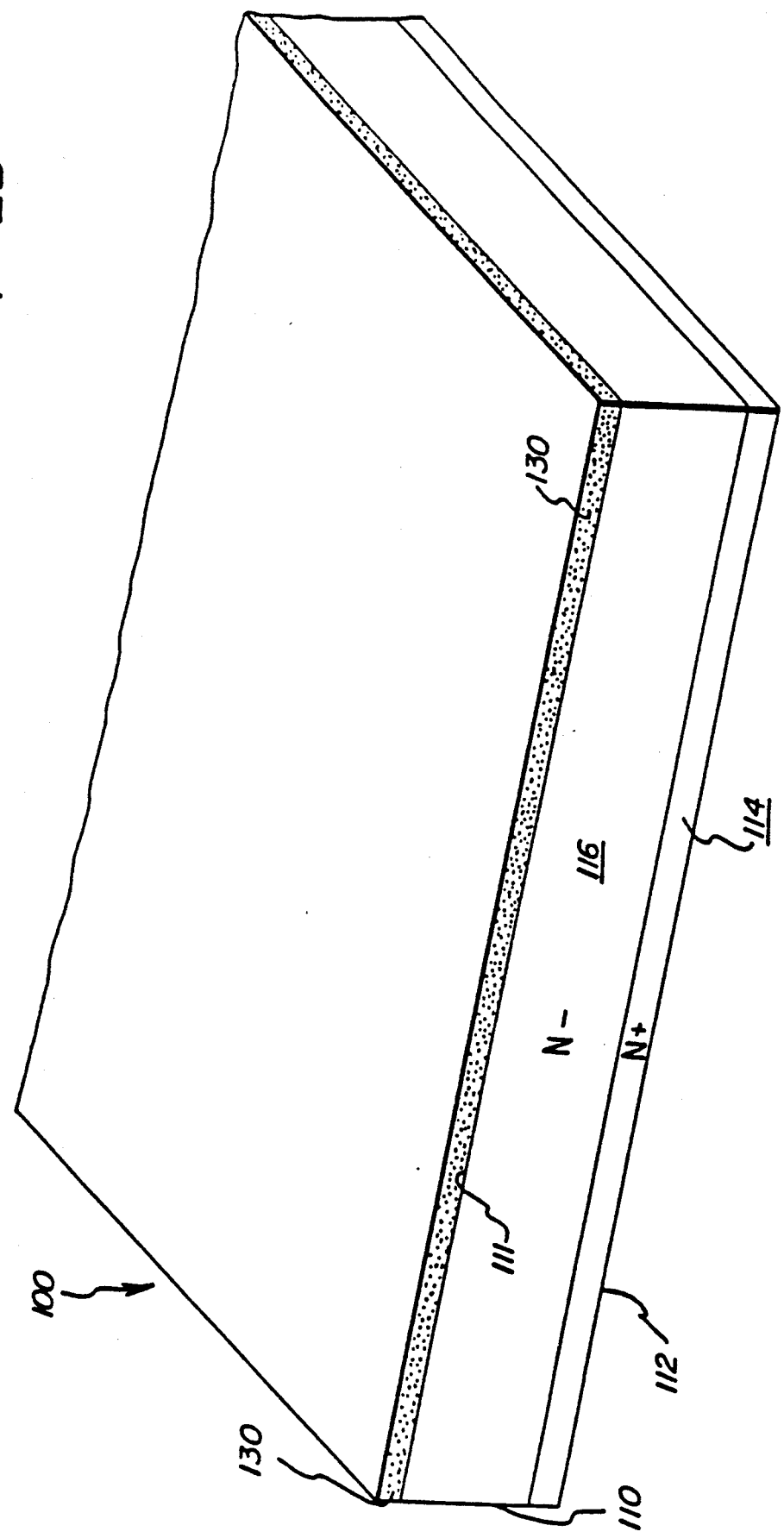

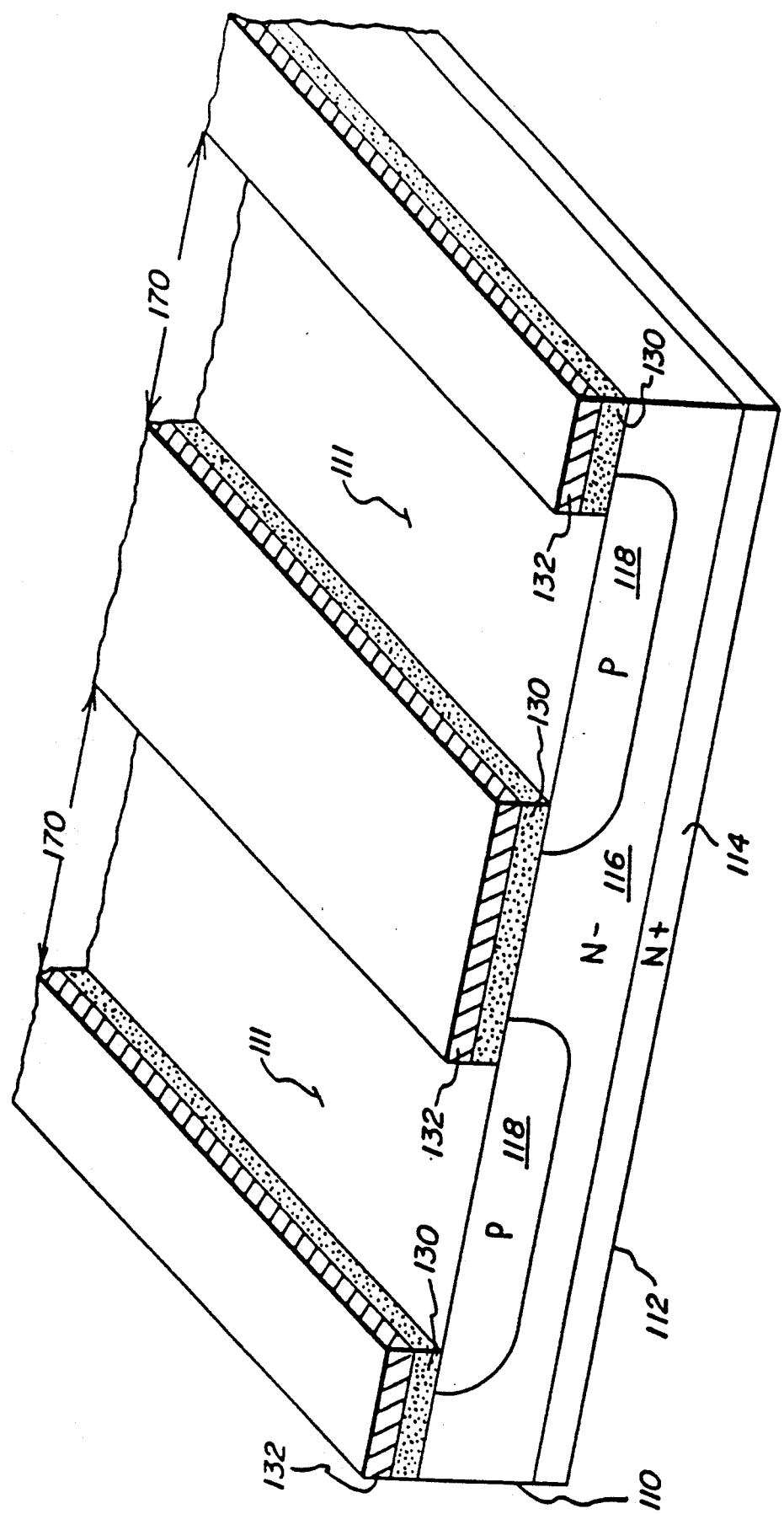

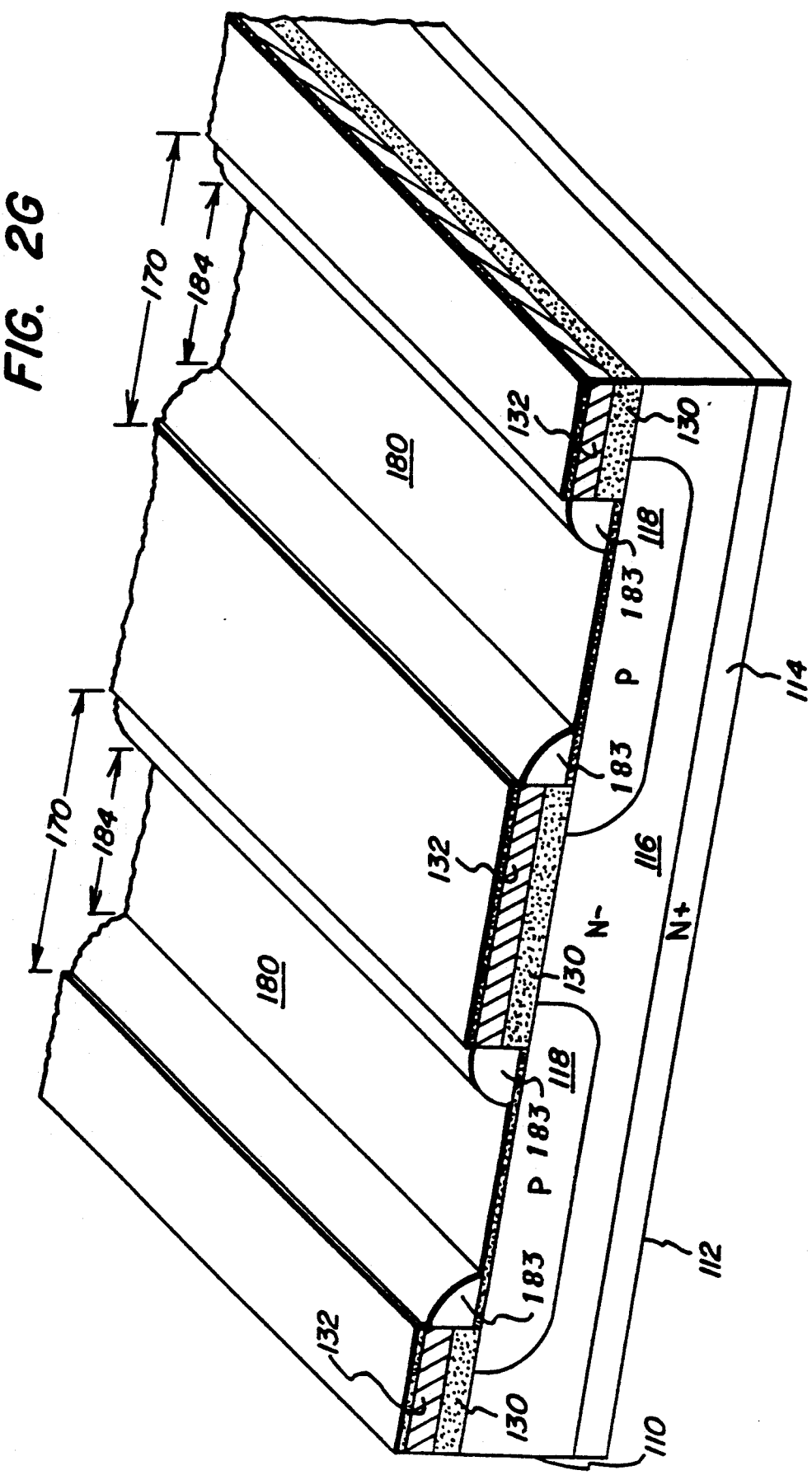

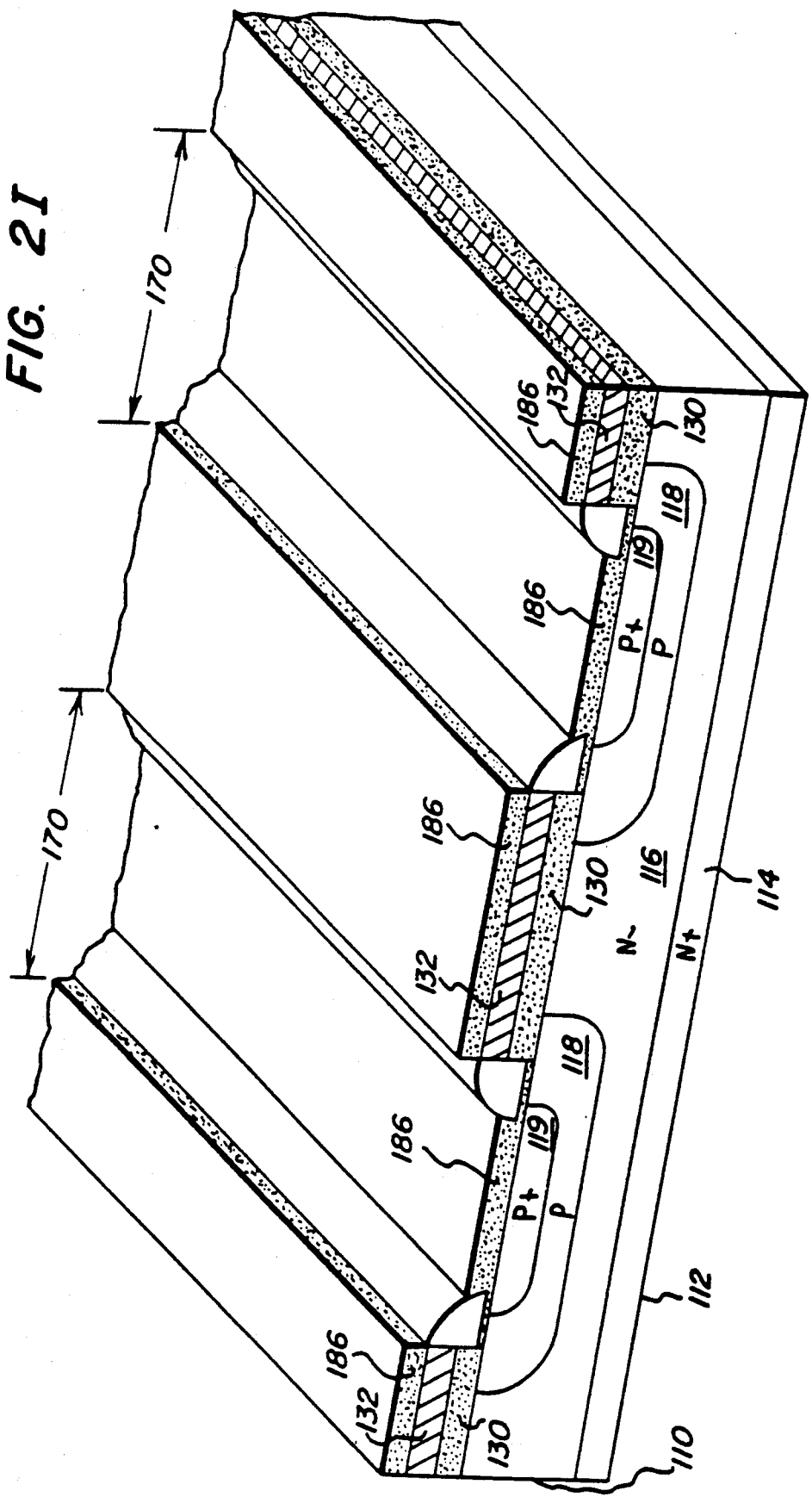

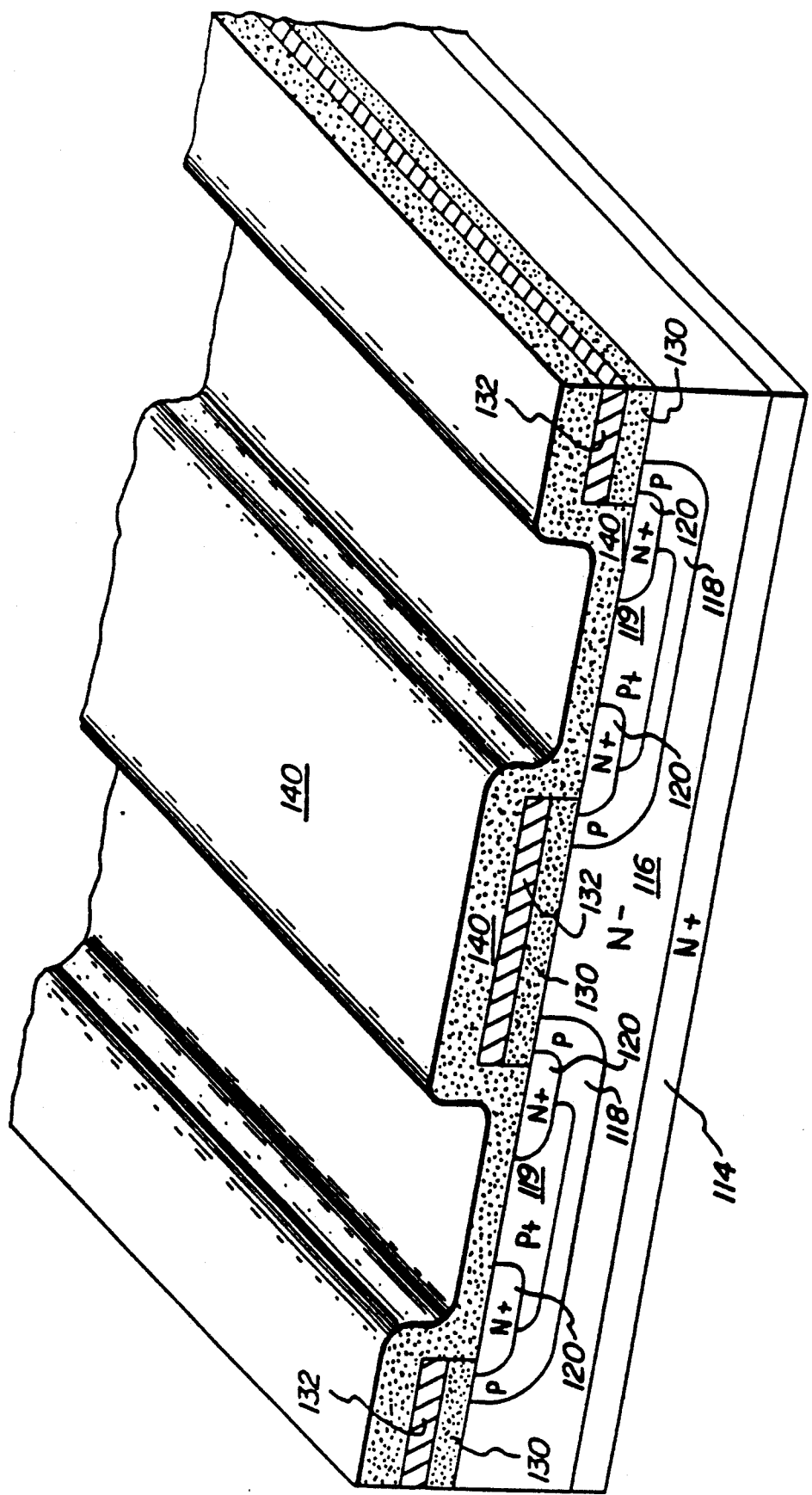

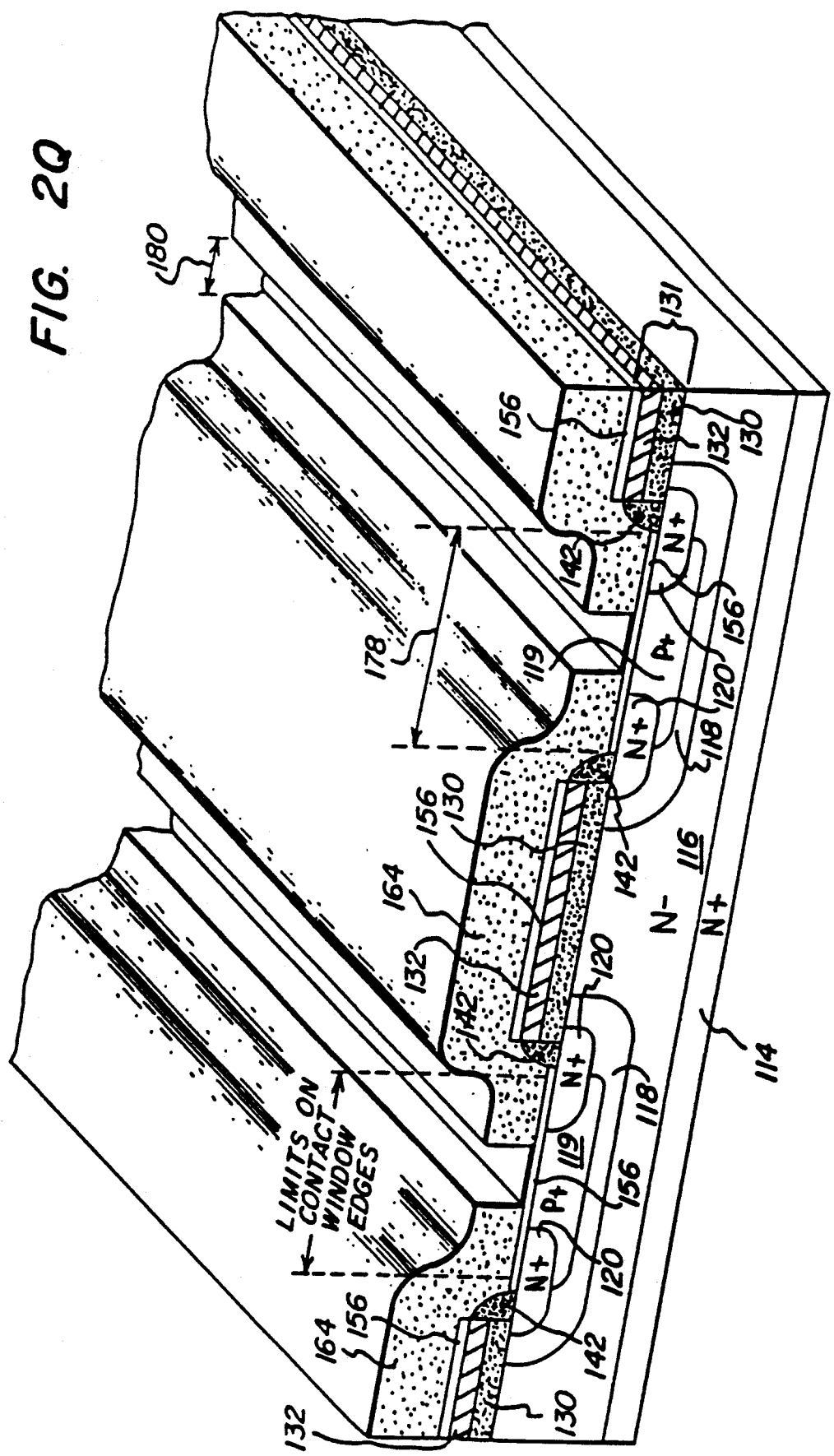

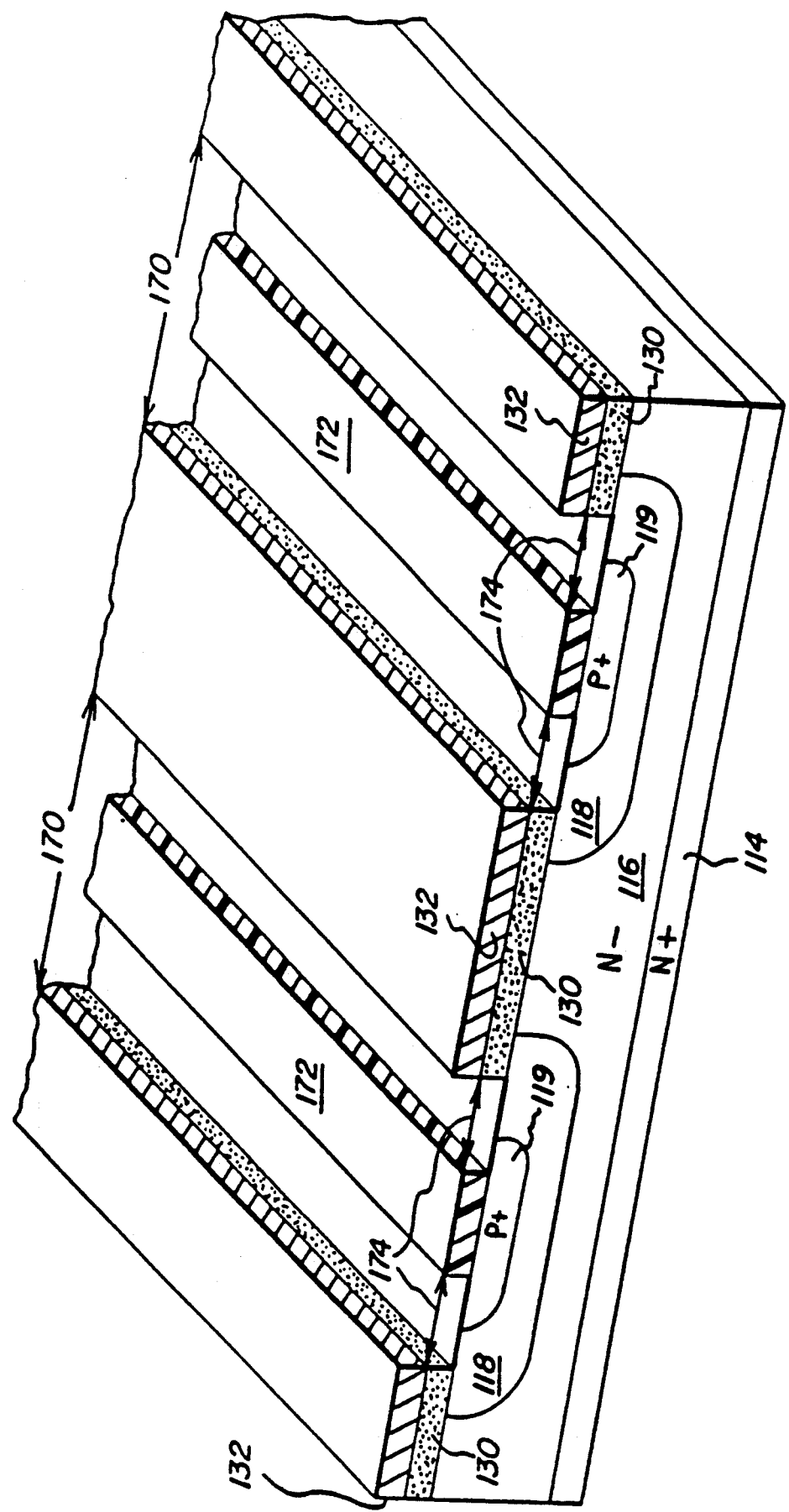

SMALL CELL, LOW CONTACT ASSISTANCE RUGGED POWER FIELD EFFECT DEVICES AND METHOD OF FABRICATION

This application is a division, of application Ser. No. 07/588,515, filed Sep. 24, 1990 now U.S. Pat. No. 5,119,153, which is a continuation of application Ser. No. 07/403,420, filed Sep. 5, 1989, now abandoned.

RELATED APPLICATIONS

This application is related to application Ser. No. 337,684, filed Apr. 13, 1989 by C. S. Korman et al., entitled "Power Field Effect Devices Having Small Cell Size and Low Contact Resistance and Method of Fabrication". That application is incorporated herein by reference.

BACKGROUND OF THE INVENTION

The present invention relates to power semiconductor devices, and more particularly, to multi-cellular, field-effect, power semiconductor devices.

BACKGROUND INFORMATION

An ideal power field effect device would have a small size, a very high current capacity and would be rugged and radiation hard. By "radiation hard", it is meant that device continues to operate properly even when exposed to significant radiation doses.

In order to maximize the ruggedness and radiation hardness of field effect devices, it is desirable to short circuit the source/body PN junction on a field effect device and to maximize the conductivity of the base region. This is to prevent undesired forward biasing of the portions of the source/body region PN junction as a result of current flow in the body region adjacent to the source region and breakdown of the source/body region PN-junction as a result of high concentrations of mobile charge carriers during periods when high reverse bias voltages are present.

FET ruggedness depends on the ability of the device structure to turn off at a time of high current flow without loss of gate control of device turnoff and without destruction of the device. This problem is most acute during turn off of inductive loads because of their current maintenance/voltage magnitude effects. The same aspects of the device structure which control device ruggedness also control transient radiation hardness of the device because a high transient radiation dose generates many hole-electron pairs within the semiconductor body. If the device is off and has a substantial voltage across it at the time the transient radiation strikes, then the resulting carriers produce electric-field-/charge-carrier-density situations which are very similar to those created during turn off of inductive loads. Consequently, an FET device structure which is rugged is normally hard to transient radiation as well. Unfortunately, conventional ruggedness enhancement techniques reduce the maximum device breakdown voltage. Thus, a tradeoff must be made between breakdown voltage and ruggedness.

In order to maximize the current carrying capacity of a vertical power field effect device, it is considered desirable to minimize the cell size or repeat distance (pitch) to maximize the device channel density. At the same time, it is considered necessary to minimize the contact resistance of the device metallization in order to minimize the contribution of the contact resistance to the ON-state resistance of the device and thus to its ON-state voltage. These two desires normally conflict with each other because device design rules and mask alignment tolerances must be considered both in determining how small a cell size can be fabricated and in determining how small a contact area between the power electrode and each cell is acceptable from a point of view of (1) electrode contact resistance, (2) ensuring contact to the required regions of the cell and (3) ON-state voltage drop.

The above-identified related application provides a solution to this conflict between small cell size and minimum contact resistance by using oxide spacers to prevent gate-to-source metal short circuits and selective silicide formation or metal deposition to ensure contact is made to all desired regions, while minimizing cell size for a given set of design rules.

Unfortunately, the structure in accordance with that application does not simultaneously minimize cell size and the resistance of the source/body region short circuit. Consequently, the devices do not have both maximum current capacity and maximum ruggedness.

There is a need for a device structure which provides the small cell size and low contact resistance of the structure disclosed in the above-identified related application in combination with the ruggedness and transient radiation hardness provided by a heavily doped body region portion disposed adjacent the source region away from the channel as the metallization contact portion of the body region.

OBJECTS OF THE INVENTION

A primary object of the present invention is to provide a minimum cell size, multi-cellular, field effect power device which has improved transient radiation hardness.

Another object is to provide a minimum cell size, multi-cellular field effect power device structure which has improved ruggedness.

Another object is to provide a minimum cell size, multi-cellular field effect power device structure with a high conductivity portion of the body region in contact with the source electrode.

Still another object is to increase the ruggedness of a power field effect device without reducing its breakdown voltage.

A further object is to eliminate an alignment critical photolithographic masking step.

SUMMARY OF THE INVENTION

The foregoing and other objects which will become apparent from the specification as a whole, including the drawings, are accomplished in accordance with the present invention through provision of a structure including a self-aligned high conductivity portion of the body region in a compact cell structure which may include a self-aligned high conductivity layer of metal or metal-silicide disposed in ohmic contact with the source region in combination with a metal-to-source-region contact area which is smaller in lateral dimensions than the metal or metal-silicide layer disposed on the source region. The metal or metal-silicide layer is preferably self-aligned with respect to an aperture in the gate electrode which is disposed over and preferably self-aligned with the body and source regions. This structure is preferably present in each cell of the multi-cellular device. Such devices preferably include a similar metal or metal-silicide layer disposed on the surface of the gate polysilicon. These field effect devices may be FETs, insulated gate bipolar transistors (IGBTs), MOS controlled thyristors (MCTs) or other field effect power devices.

Such a device structure may be fabricated in accordance with one embodiment of the invention by (1) oxidizing the surface of a one type conductivity semiconductor wafer to form an oxide layer, (2) depositing a polysilicon gate layer on top of the oxide layer, (3) patterning the polysilicon gate layer to provide an aperture therein which serves as a first window, (4) forming a body region of opposite type conductivity in the wafer beneath the first window and in self-alignment therewith, (5) depositing a thick conformal layer of dielectric over the entire upper surface of the wafer, (6) anisotropically etching the thick conformal dielectric layer to remove the thick dielectric layer everywhere except along the edges of the first window where the polysilicon gate layer stops with a sharp vertical edge to create a second smaller window within the first window and self-aligned with respect to the first window, (7) more heavily doping a central portion of the opposite conductivity type portion of the body region beneath the second window and in self-alignment therewith, (8) selectively forming a masking layer in said second window, (9) removing the remaining portions of the thick dielectric layer without removing said masking layer thereby forming an annular third window, (10) forming a source region of one type conductivity in the body region beneath the third window, (11) removing the masking layer, (12) driving the source and body region diffusions in, (13) depositing a thinner conformal dielectric layer over the entire upper surface of the wafer, (14) anisotropically etching the thinner conformal dielectric layer to remove that dielectric layer everywhere except along the edges of the first window where the polysilicon gate layer stops with a sharp vertical edge (the portion of the dielectric layer which is not removed adjacent the edge of the gate window serves as a spacer which separates the wafer surface into separate fourth and fifth windows which are respectively coextensive with (a) the top of the polysilicon gate electrode layer and (b) the portions of body and source regions which are not covered by the spacer or the gate electrode), (15) selectively forming silicide layers only on the exposed surfaces of the polysilicon gate electrode and the source/body regions, (16) forming a thick passivating dielectric layer over the upper surface of the wafer, (17) opening source/body contact holes in the thick dielectric layer and (18) forming metallization on the upper surface in ohmic contact with the source/body region.

Alternatively, where a metal layer is to be used instead of a metal silicide layer, the metal layer may be deposited using a process which deposits the metal on single crystalline and polycrystalline silicon, but not on silicon oxide. This results in fewer process steps.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 3 illustrates an alternative step in the FIG. 2 process.

DETAILED DESCRIPTION

Figure 1:
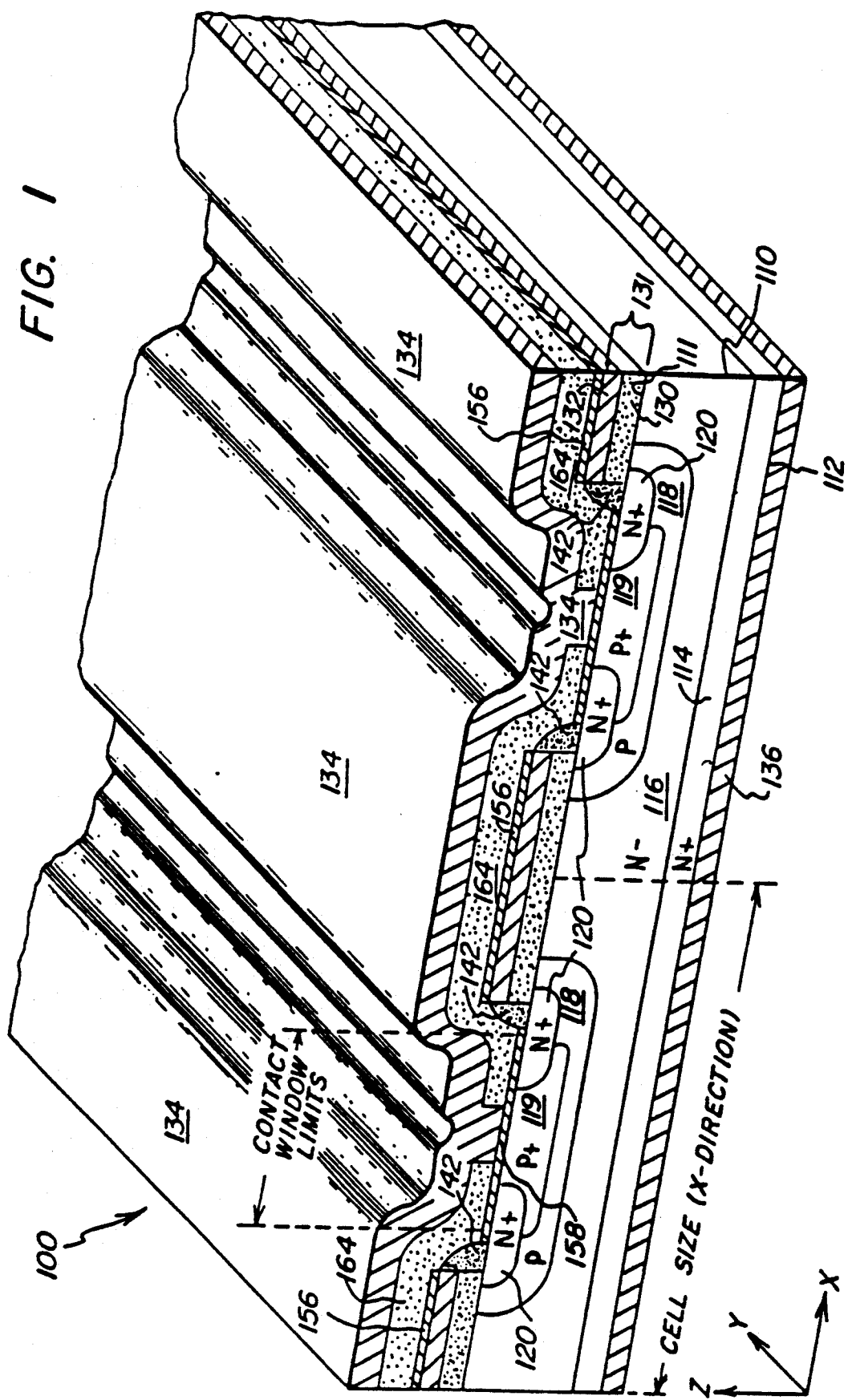
FIG. 1 is a perspective cross-section illustration of a portion of a multicellular device structure in accordance with the present invention.

A device 100 in accordance with the present invention is illustrated in a perspective, cross-section view in FIG. 1. The device 100 comprises a body 110 of silicon semiconductor material having an upper surface 111 and a lower surface 112. The surfaces 111 and 112 are opposed major surfaces of a wafer and are normally substantially parallel to each other. The body 110 comprises an N+drain region 114 which is disposed adjacent the lower surface 112 of the semiconductor body, a N−drift region 116 disposed contiguous to and above the drain region 114. A body region 118 of P type material extends into the drift region from the upper surface 111 of the semiconductor body. An N+ source region 120 extends into the body region 118 from the upper surface 111 of the semiconductor body.

A heavily doped (P+) portion 119 of the body region extends from beneath the source region 120 to the upper surface 111 in an aperture in the source region. The heavily doped portion, 119 of the body region extends along under the source regions, but not as far as the channel region portion of the body region 118. The region 119 greatly increases the ruggedness and radiation hardness of this device as compared to a device in which the body region is substantially uniformly doped which limits the body region conductivity in accordance with the desired device threshold voltage. An insulated gate electrode 131 is disposed on the upper surface 111 of the semiconductor body. The gate electrode is comprised of an insulating layer 130 (preferably thermal oxide) disposed directly on the upper surface 111 of the semiconductor body and a conductive polycrystalline silicon layer 132 disposed on that gate oxide. The upper surface of the polycrystalline silicon 132 comprises a titanium-silicide layer 156 which serves to provide the gate electrode with high lateral conductivity. In fact, the lateral conductivity of the titanium silicide layer is easily made high enough that the polycrystalline silicon 132 itself does not need to be highly conductive. This provides the advantage of minimizing the tendency of a dopant (which would otherwise be used to raise the conductivity of the polycrystalline silicon) to diffuse into or through the oxide layer 130. Another titanium-silicide layer 158 is disposed in contact with the source region 120 and the heavily doped portion 119 of the body region where they extend to the surface within the aperture in the gate electrode. The metal-silicide layer 158 is spaced from the gate oxide 130 and the gate polycrystalline silicon 132 by a spacer 142 of oxide. The metal silicide layer 158 is self-aligned with respect to the aperture in the polycrystalline silicon insulated gate electrode 131. An overlying source metallization layer 134 makes ohmic contact to the metal-silicide layer 158 near the X-direction center of that metal-silicide layer. As illustrated in FIG. 2Q, it is not necessary that the contact between the metallization 134 and the metal-silicide layer 158 be disposed over the source region or extend across the entire surface intercept of the body region portion 119 within the aperture in the source region 120.

The extension of the heavily doped body region portion 119 to the surface 111 locally spaces the lefthand portion of the source region 120 from the righthand portion of the source region 120 which is within that cell. We say locally spaces because the lefthand and righthand portions of the source region of a single cell are normally connected together in the portion of the structure which is not visible in the figures. In the absence of the metal-silicide layer 158, displacement of the contact window from either the lefthand or righthand portion of the source region would adversely affect device performance since the non-contacted portion of the source region would only be connected to the metallization through a relatively long current path within the source region itself. The present device structure provides a substantial advantage over the device disclosed in the related application because the presence of the p+ portion 119 of the body region greatly increases both the ruggedness and the radiation hardness of the device.

While the structure illustrated in the figures is a vertical FET, this invention is applicable to any device having a similar structure, and in particular, is applicable to insulated gate bipolar transistors (IGBTs), to MOS controlled thyristors (MCTs) and so forth. These other device types will include additional layers in a manner well known in the art. For example, an IGBT will include an additional layer of P type material between the electrode 136 and the drift region 116.

The cells of the device 100 are shown and have been described as being parallel, elongated (straight stripe) cells which extend in the Y-direction. However, this invention is also applicable to cells of other shapes or configurations, including but not limited to rectangular, including square; hexagonal; round or elliptical, including circular; and so forth.

In a multi-cellular device, such cells may all be of substantially uniform size and packed along the wafer surface in an array pattern or may be arranged in a concentric configuration as may be desired.

The device of FIG. 1 may be fabricated in accordance with a process whose steps are illustrated in FIGS. 2A-2Q.

Referring now to FIG. 2A, the beginning of a process for producing the device 100 is shown. In FIG. 2A, a semiconductor wafer 110 has an upper surface 111 and a lower surface 112. The surfaces 111 and 112 are opposed major surfaces of the wafer 110. Adjacent to the lower surface 112 is an N+ layer 114 which forms the drain region of the final device. The remainder of the wafer in FIG. 2A is a lightly doped N type (N-) layer 116 which, in the final device, comprises the drift region of the device. The layer 116 may be formed by epitaxial growth of N- material on an N+ substrate 114.

Figure 2C:
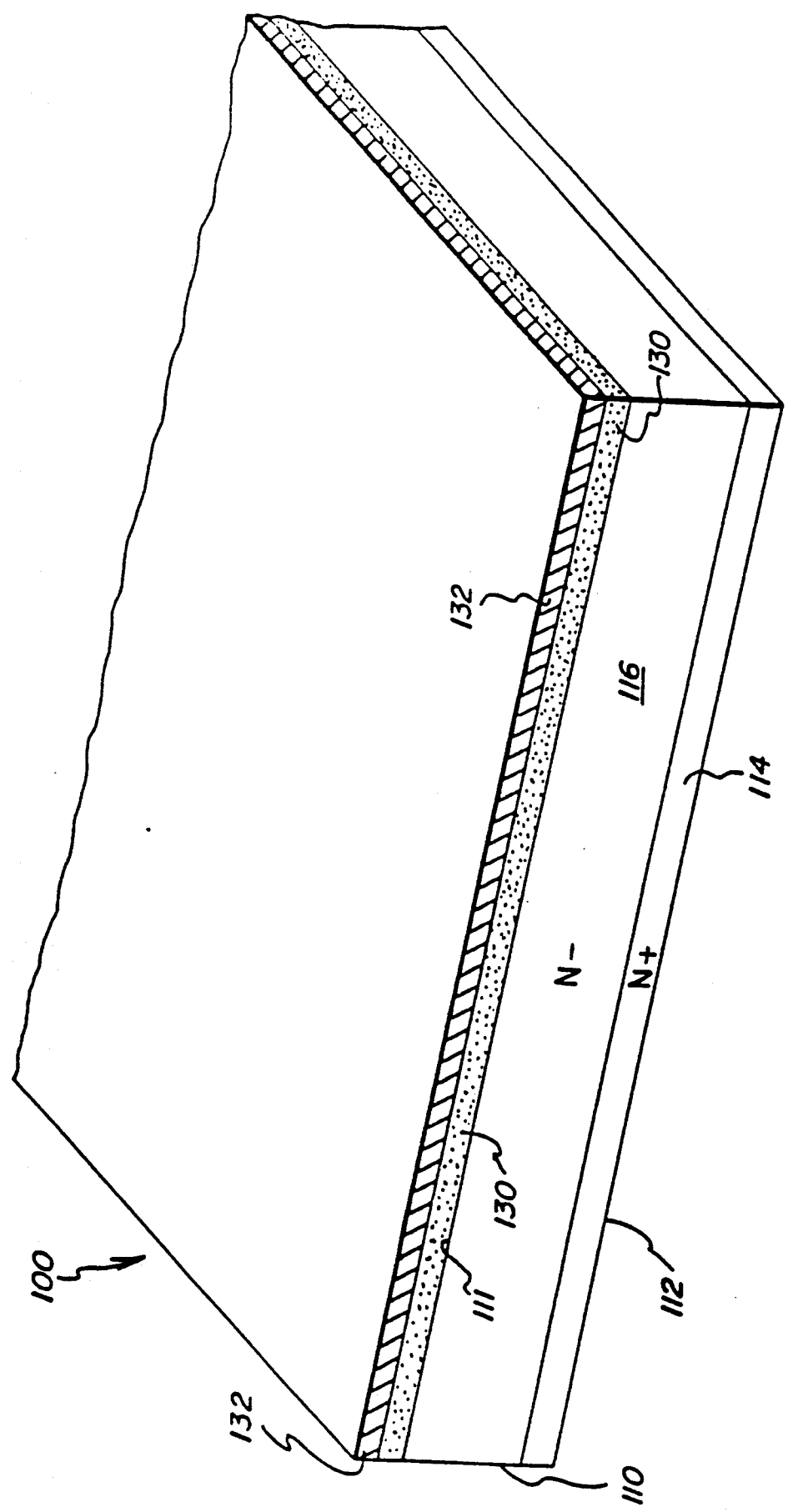
FIGS. 2A–2Q illustrate a method in accordance with the present invention for fabricating the device of FIG. 1.

In FIG. 2B, the upper surface of the wafer has been thermally oxidized in a manner well known in the art to form a 250-1,000 angstrom thick thermal oxide layer 130 across the entire upper surface of the wafer 110. Thereafter, in FIG. 2C, a substantially uniform layer 132 of polycrystalline silicon has been deposited on top of the oxide layer. The polycrystalline silicon may preferably have a thickness of 2,000 to 8,000 angstroms and may be deposited in any well known manner such as by pyrolytic decomposition of silane ($SiH_4$).

Figure 2D:
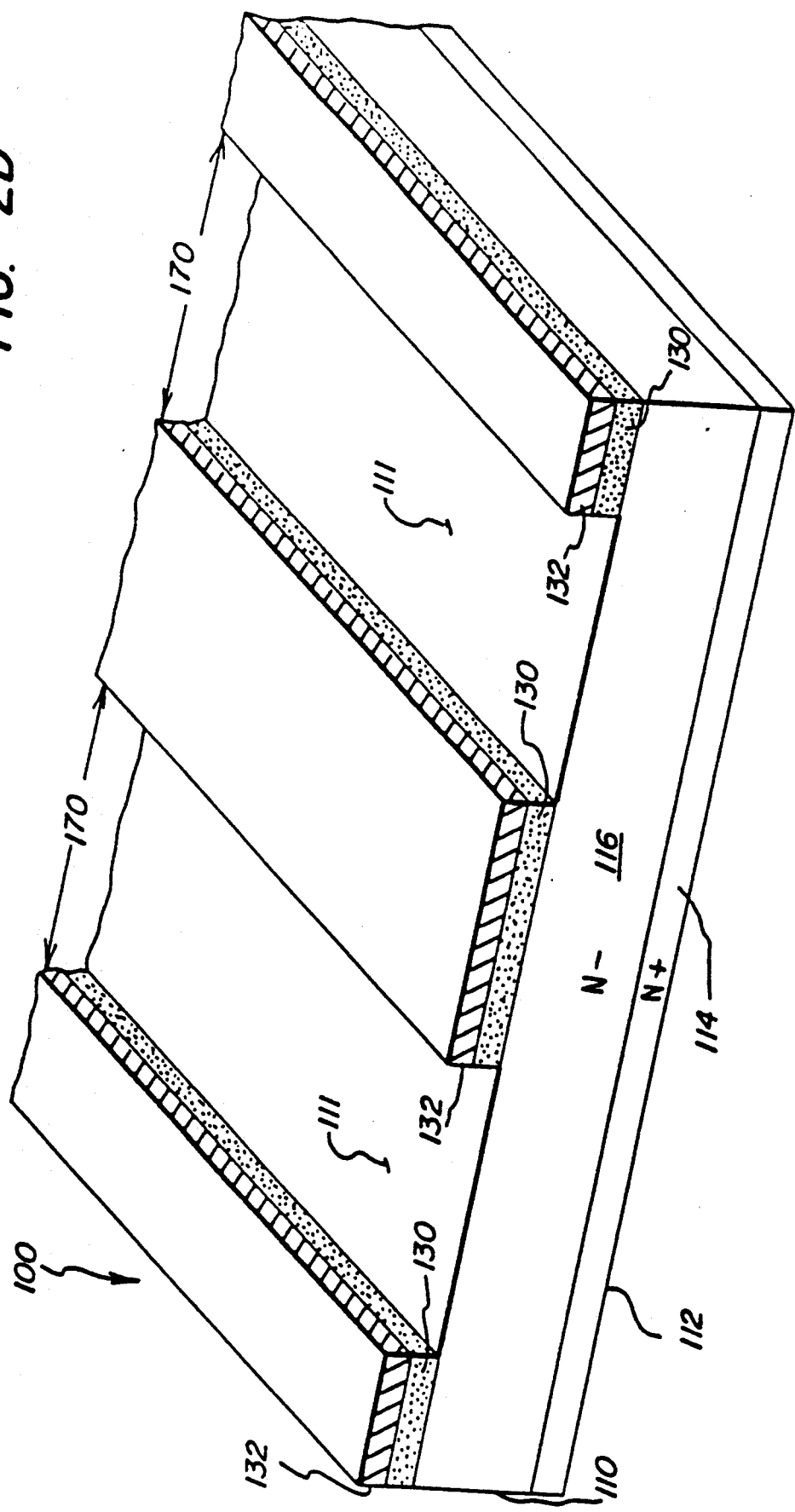

In FIG. 2D, the polycrystalline silicon layer 132 and the oxide layer 130 have been patterned and etched away to form a window 170 at the bottom of which the upper surface 111 of wafer 110 is exposed. It is important to the proper operation of the process that the edges of the polycrystalline silicon and oxide at the edge of the window have essentially vertical surfaces. One method of providing such vertical walls is to etch the window 170 by reactive ion etching (RIE).

A P type body region 118 is formed within the N-region 116 in alignment with window 170 by ion implantation of a P type dopant. The structure following the formation of the P type region 118 is illustrated in FIG. 2E.

Figure 2F:
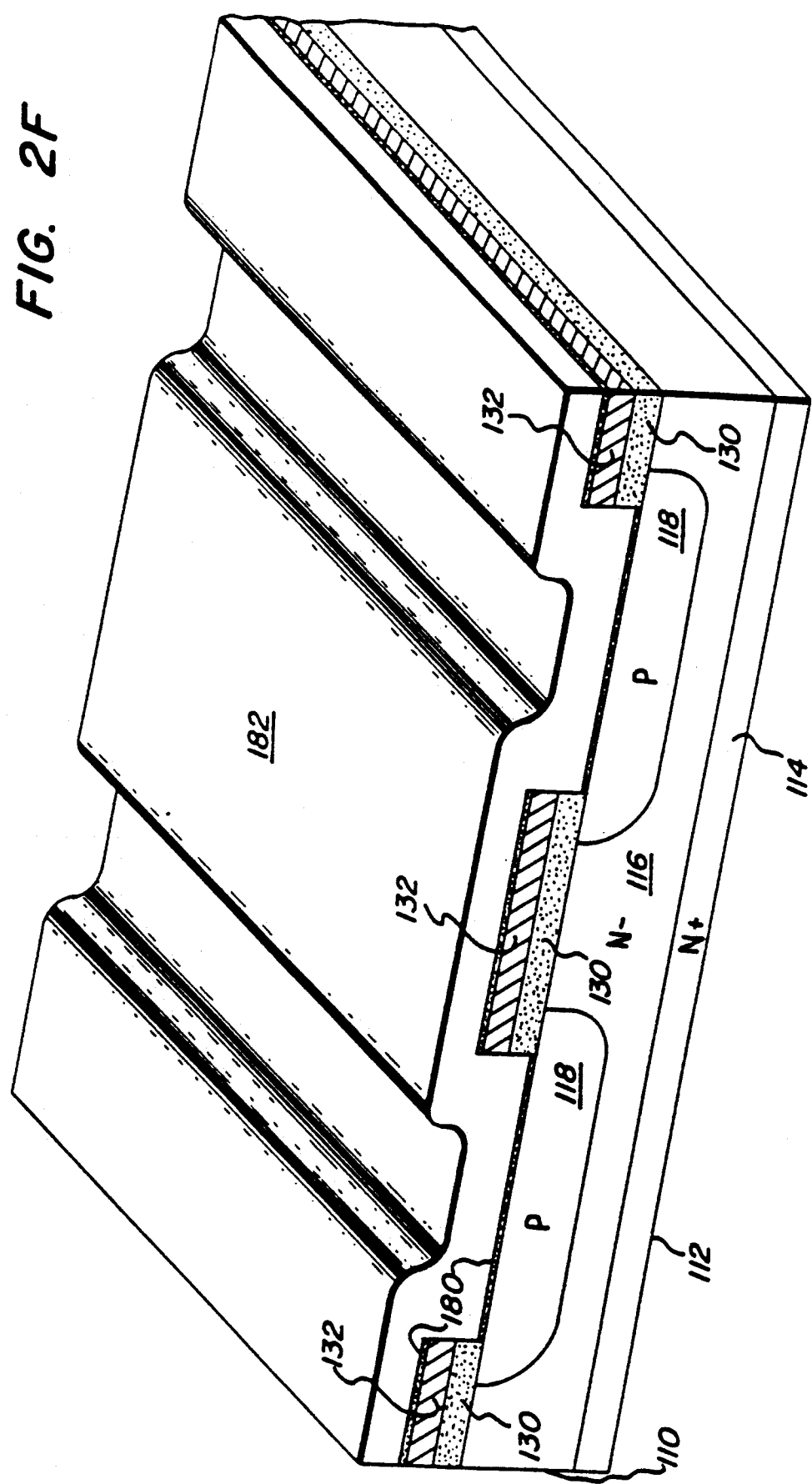
Figure 2H:
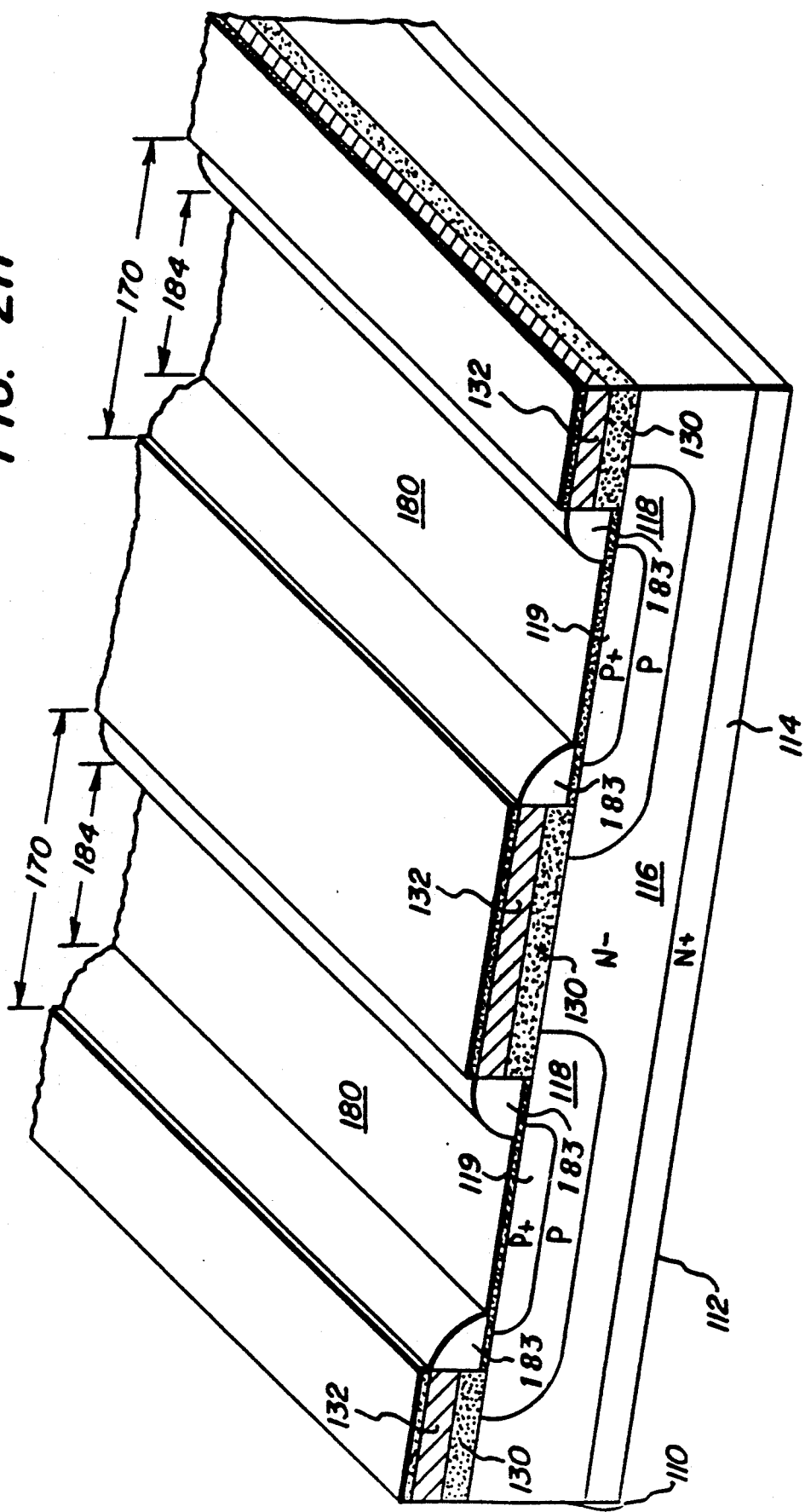

Next, a thin thermal oxide layer 180 (FIG. 2F) is grown on the exposed surface of the wafer and the polycrystalline silicon. This is to protect the quality of the wafer silicon. Thereafter, a thick silicon nitride layer 182 is deposited over the entire upper surface of the wafer. This is a conformal dielectric layer. What is meant by a "conformal layer" of a dielectric or other material in this patent is a layer which deposits to a uniform depth over both horizontal and vertical portions of the upper surface of the semiconductor wafer. Thus, the thickness of the nitride 182 is substantially the same when measured vertically from horizontal portions of the upper surface of the polycrystalline silicon 132 and when measured horizontally from vertical portions of the surface of the polycrystalline 132 at the edges of the window 170. The wafer is shown in FIG. 2F after the completion of the deposition of the silicon nitride layer. Next, the silicon nitride layer 182 is anisotropically etched by reactive ion etching (RIE) the wafer in a gas mixture consisting of $CHF_3$ and argon. This anisotropic etch works primarily in the vertical direction with the result that when the upper surface of the thin oxide layer 180 has just been cleared of silicon nitride, there is a segment 183 of the silicon nitride left adjacent to each vertical wall of the polycrystalline silicon 132 at the edges of the windows 170 as shown in FIG. 2G. These nitride segments 183 whose width is virtually the same as the original thickness of the deposited silicon nitride, stand essentially as high as the top of the polycrystalline silicon and are referred to as nitride spacers. Consequently, the vertical etching of the silicon nitride is stopped as soon as the surface of the thin oxide layer 180 has been exposed. This creates a window 184 in the center of the body region 118. This window 184 has the same shape as, and is smaller than is centered in the window 170 and self-aligned to it and thus is concentric with window 170. This self-aligned method of forming this window eliminates an alignment critical photolithographic step which is common to prior art processes. Next, a heavy concentration of a p-type dopant such as boron is ion implanted into the body region 118 beneath the window 184 to create a p+ region 119. This implantation may preferably be done at an implantation energy of 80 Kev and with a concentration sufficient to provide the region 119 in its final driven form with a dopant concentration which exceeds that of the P base and provides a surface concentration of about 1 to $5 \times 10^{19}$ per $cm^3$. The wafer at the end of this step is illustrated in FIG. 2H.

Next, the wafer undergoes a thermal oxidation step to thicken the exposed thermal oxide layers 180 to create the relatively thick oxide layers 186 shown in FIG. 2I on top of the polycrystalline silicon and in the window 184. At the end of this oxidation step the wafer appears as illustrated in FIG. 2I.

Figure 2J:
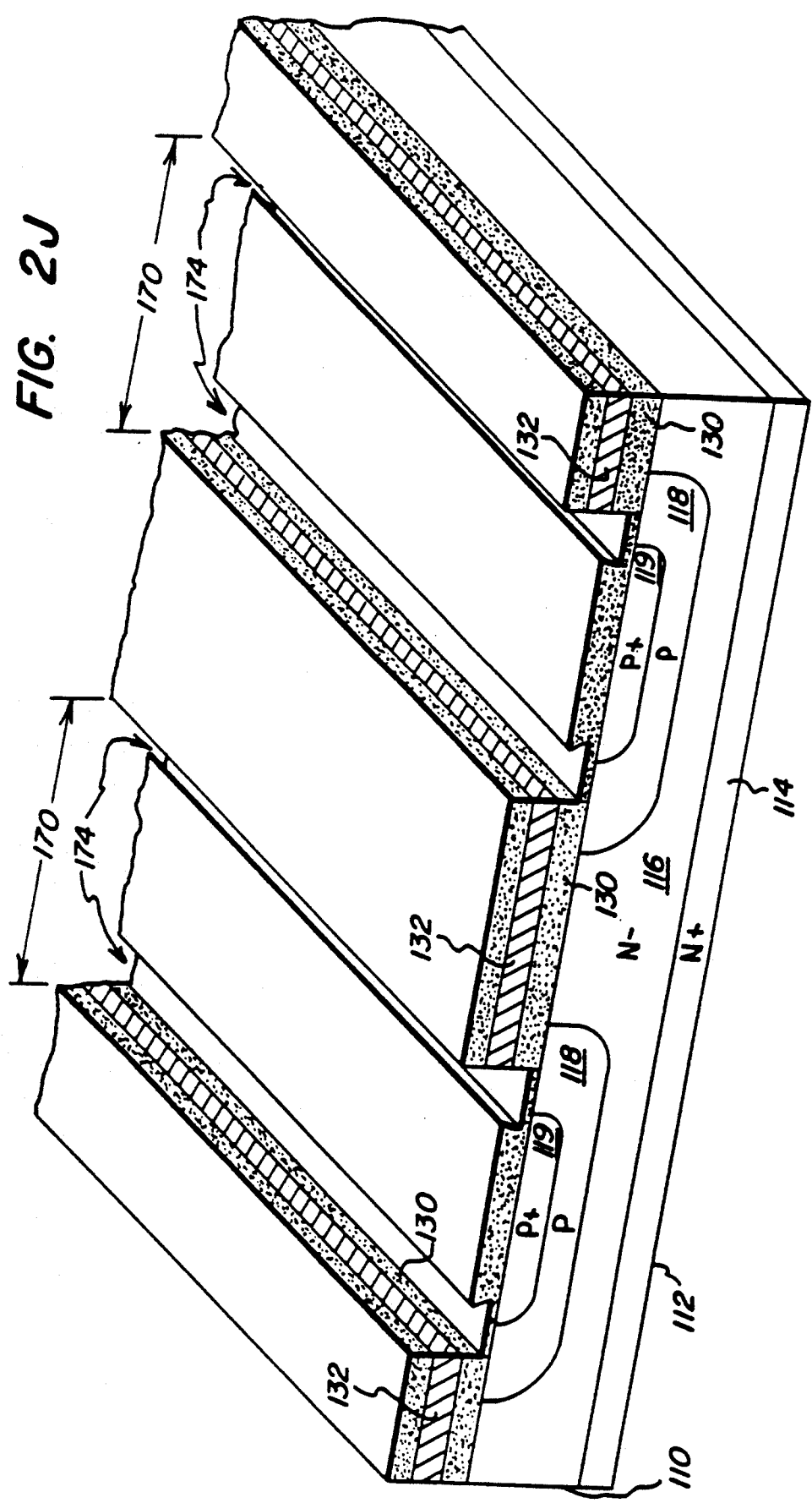

Next, the remaining portions of the silicon nitride layer 182 are removed by selective wet etching to create an annular window 174 in each of the windows 170 as shown in FIG. 2J. The windows 174 still have a thin oxide layer 180 therein. This also eliminates a photolithographic step present in prior art processes.

Figure 2K:
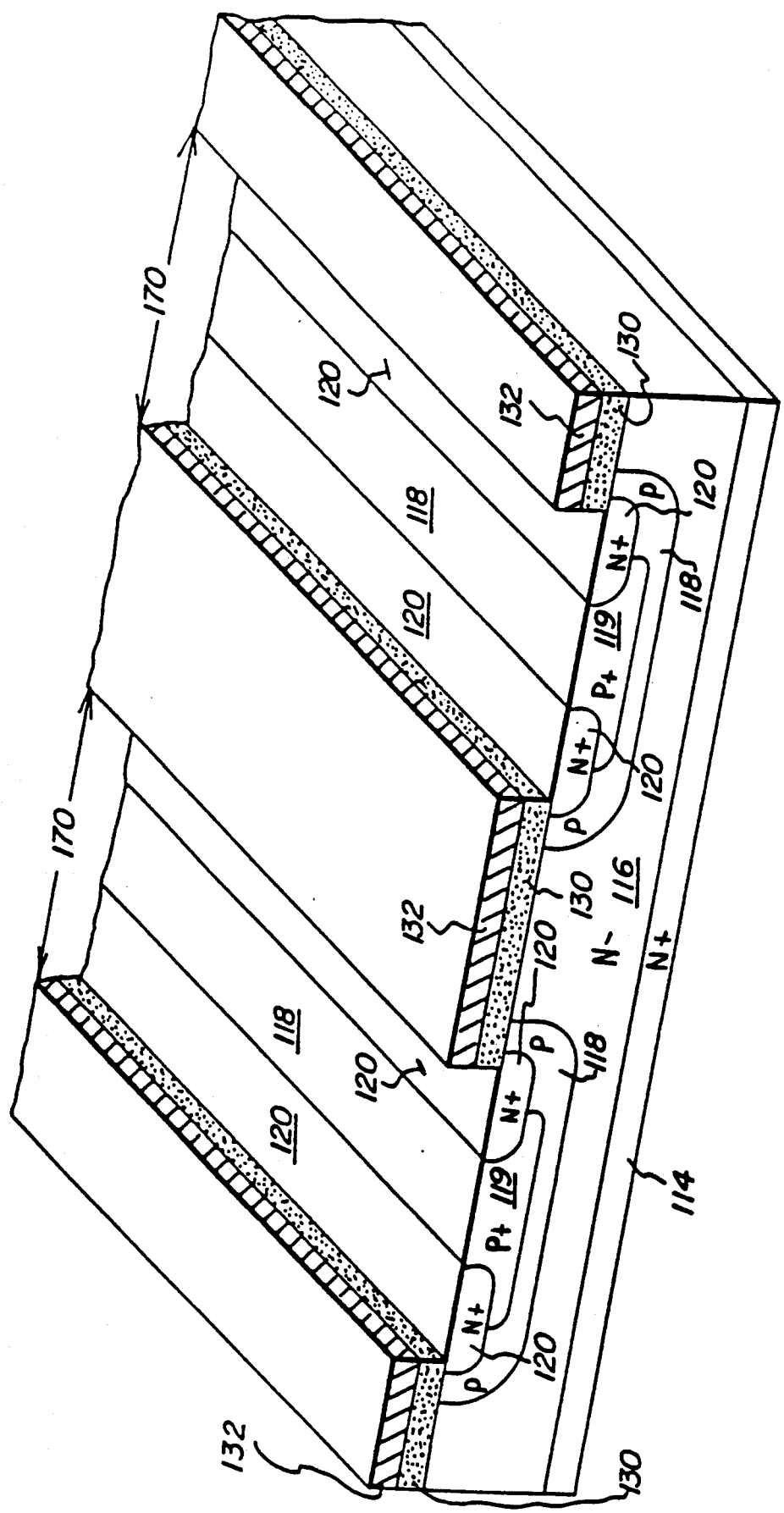

A heavy concentration of an N-type dopant, which may preferably be arsenic, is then implanted into the body region 118 beneath the windows 174. This implantation may preferably be done at an implant energy of 180 Kev and with a concentration sufficient to provide final N+ source regions 120 having a surface dopant concentration of 1 to $3 \times 10^{20}$ per $cm^3$. The oxide layers 186 are thick enough to prevent implantation of the arsenic into the P+ region 119. Next, source region 120 and P+ region 119 implantations are annealed and driven to essentially their final configuration. Thereafter, the thermal oxide layers 180 and 186 are stripped from the wafer and the wafer appears as shown in FIG. 2K.

If it is desired to implant the source region dopant in the polycrystalline silicon to increase its conductivity, then, prior to removing the silicon nitride spacers, a photoresist mask is formed on the wafer surface and patterned to restrict the photoresist to covering the P+ region 119 and a portion of each of the silicon nitride spacers 182. A brief oxide etch then removes the oxide layers 186 from top the polycrystalline silicon. The source implant is then performed.

Next, a 4,000-8,000 Angstrom thick layer of high temperature oxide (HTO) is deposited on the wafer and the wafer appears as shown in FIG. 2L. This high temperature oxide deposition is preferably done at a temperature in the vicinity of 900° C. by decomposition of dichlorosilane by nitrous oxide. The result is a conformal layer of oxide. Other dielectrics may be used as is appropriate.

Figure 2M:
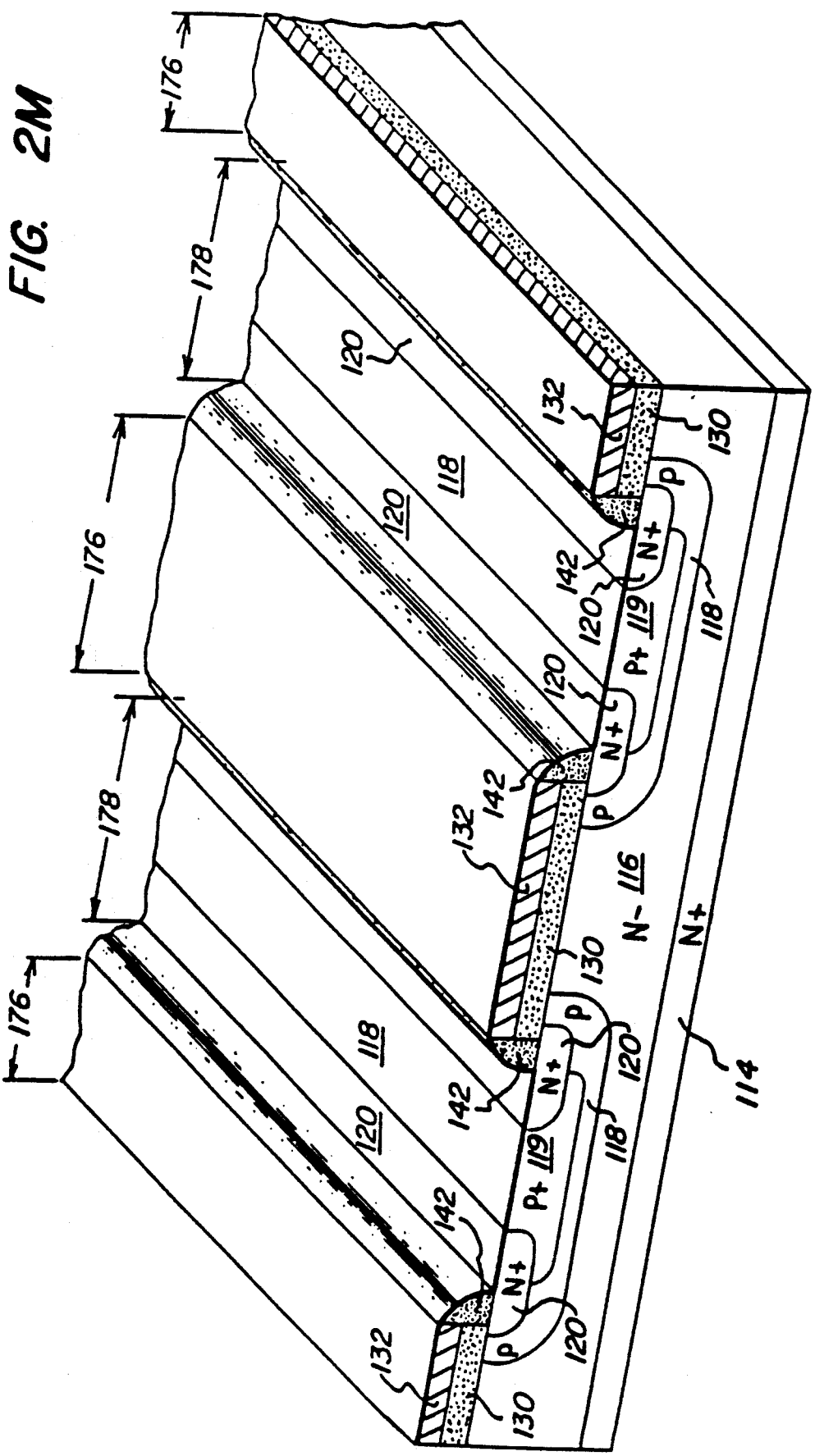

Thereafter, the high temperature oxide (HTO) is anisotropically etched by reactive ion etching (RIE) the wafer in a gas mixture consisting of trifluoromethane ($CHF_3$) and argon (Ar). This anisotropic etch works primarily in the vertical direction with the result that when the upper surface of the polycrystalline silicon and the upper surface of the semiconductor body have just been cleared of HTO, there is a segment of the HTO left adjacent to each vertical wall of the polycrystalline silicon 132 at the edges of the windows 170 as shown in FIG. 2M. These oxide segments whose width is virtually the same as the original thickness of the deposited oxide, stand essentially as high as the top of the polycrystalline silicon and are referred to as oxide spacers. Consequently, the vertical etching of the HTO is stopped as soon as the surface of the polycrystalline silicon and the surface of the semiconductor body have been exposed. As a result, two separate windows are created, i.e., a fourth window 176 consisting of the upper surface of the polycrystalline silicon 132 and a fifth window 178 consisting of the exposed upper surface of the body region 118 and the source region 120 as shown in in FIG. 2M.

Figure 2N:
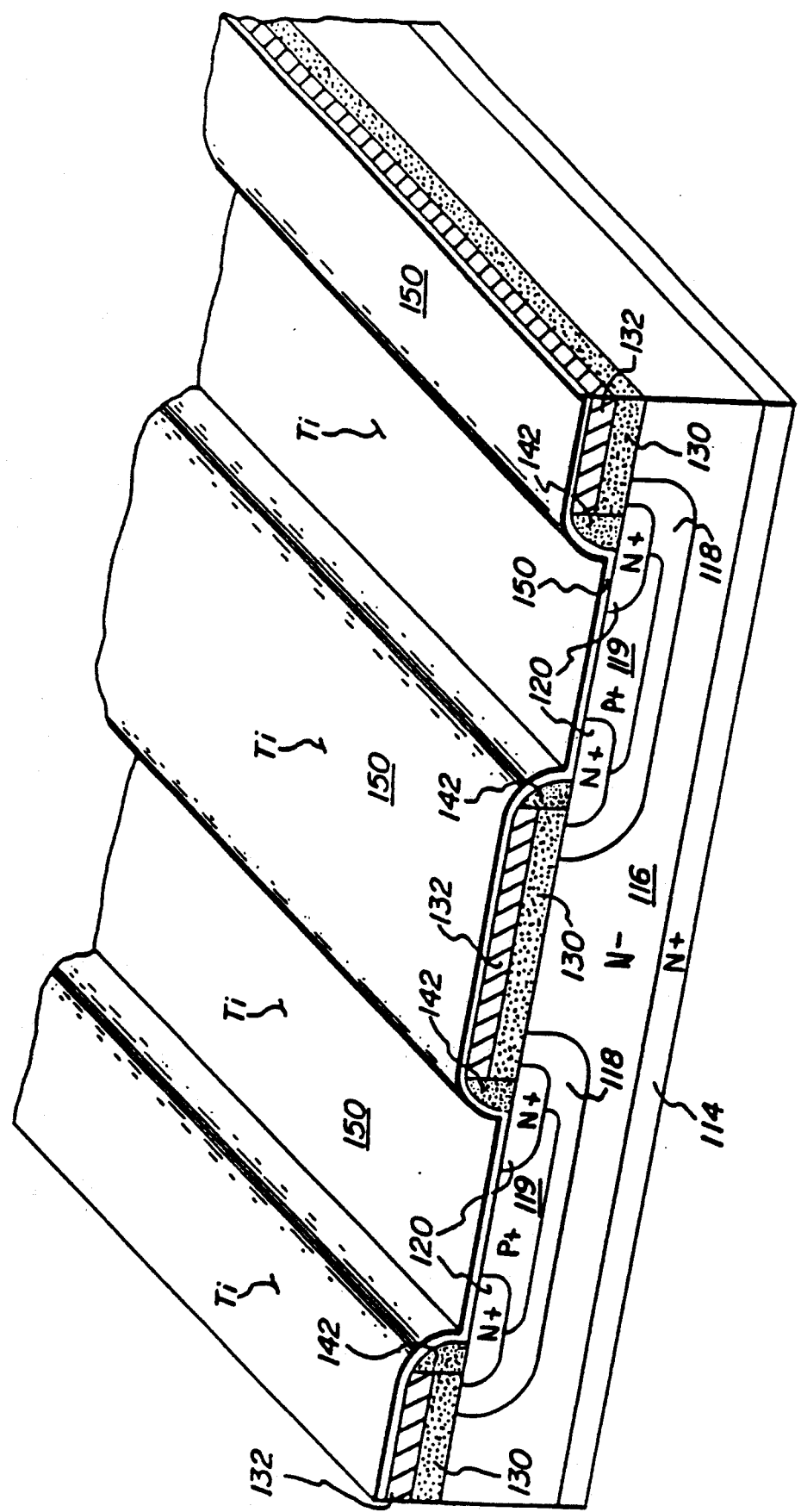
Figure 20:
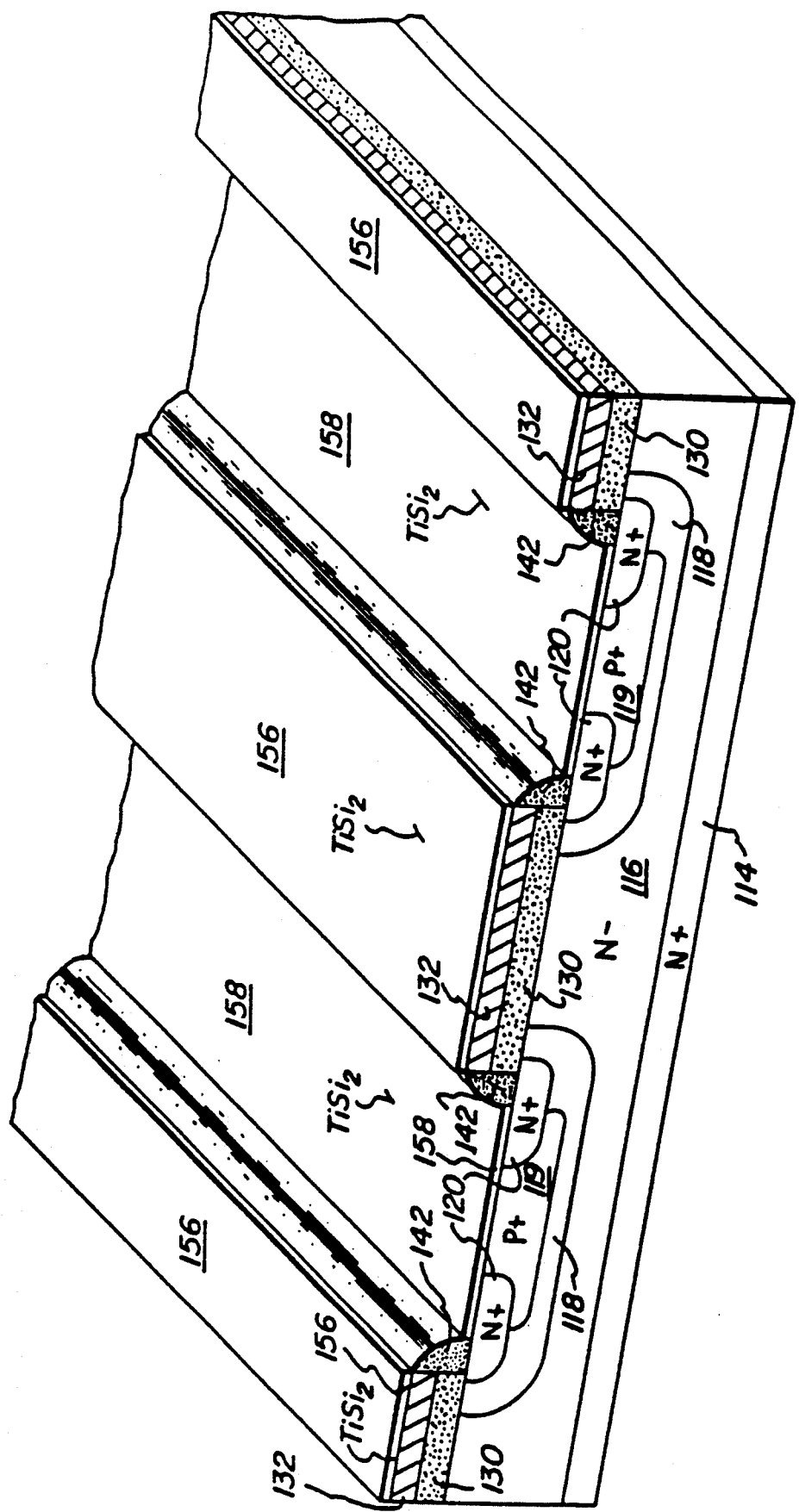

Next, a 1,000 Angstrom thick layer of titanium (Ti) is sputtered onto the upper surface of the wafer (FIG. 2N). Thereafter, under carefully controlled conditions, the titanium is reacted with the silicon of the polycrystalline silicon or the semiconductor body (in accordance with its location) to create titanium silicide. Two different methods of doing this are known at this time, but any other method may be utilized. The first method employs a furnace. The wafer is placed in a furnace which is set to 600° C. for a period of 40 minutes in a forming gas (80% $N_2$ and 20% $H_2$) or in pure $N_2$. At the end of this period, a metastable form of $TiSi_2$ has formed on the silicon surfaces with very little reaction with the oxide of the spacer. The wafer is then wet etched in a mixture of concentrated sulfuric acid and $H_2O_2$ in a 50:50 mixture for about 10 minutes. This removes the unreacted titanium from the wafer. This removal is primarily from the oxide spacer. This etch also removes any titanium nitride (TiN) which may have been formed. Thereafter, the wafer is reacted a second time in a furnace at a temperature in the range of from 800°-850° C. for a period of 40 minutes in forming gas. At the end of this step, the titanium silicide is in a highly stable form ($TiSi_2$).

As an alternative, the silicide reaction can be induced using rapid thermal anneal (RTA) in which a high flux halogen lamp is used to heat the surface of the semiconductor body to a much higher temperature. The wafer is exposed to this lamp for approximately 20 seconds in a nitrogen ambient to produce an average temperature of 600° C. Thereafter, the wafer is etched in a concentrated sulfuric acid/$H_2O_2$ etchant in the same manner as has just been described with respect to the furnace process. Thereafter, the wafer is exposed to a higher flux from the halogen lamp to heat it to an average temperature of 800°-850° C. for 20 seconds. At the end of this process, a stable titanium silicide is provided. In this rapid thermal anneal process, the actual temperature of the surface of the wafer cannot be easily determined because it is a transient temperature and the 600° and 800° average temperatures are measured in the presently accepted manner in the art. It is recognized, that these temperatures probably do not accurately reflect the actual temperature at the surface of the wafer on which the flux from the halogen lamp impinges.

At the end of this time, a 2,000 Angstrom thick layer 156 of titanium silicide ($TiSi_2$) is disposed on the polycrystalline silicon of the gate electrode and a 2,000 Angstrom thick layer 158 of titanium silicide ($TiSi_2$) is disposed over the body and source regions within the window 178 as shown in FIG. 2O. Additionally, a layer of a barrier material such as TiN may be formed in situ during TiSi formation, if done in an $NH_3$ ambient.

Figure 2P:
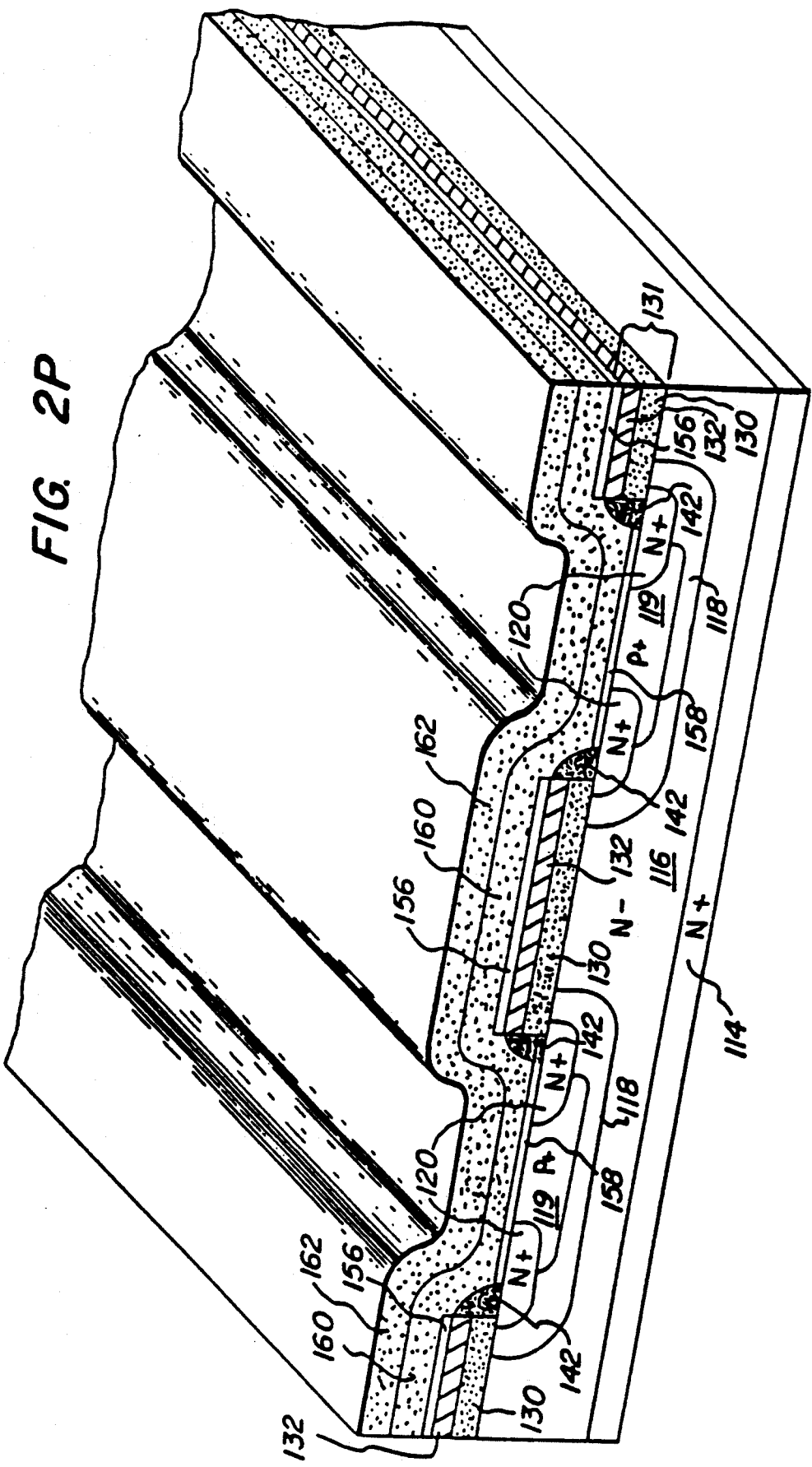

Thereafter, a 4,000 Angstrom thick layer 160 of low temperature oxide (LTO) is deposited over the wafer at a temperature of about 450° C. by low temperature CVD. This layer is preferably conformal, but need not be. The source gases may preferably be silane and oxygen as is known in the art. This low temperature oxide layer includes many pinholes. It is therefore densified at a temperature in the 800°-900° C. range in a nitrogen atmosphere for a period of from 30 to 60 minutes. This densification temperature is preferably kept low enough that there is not much titanium diffusion from the titanium silicide into the silicon of the gate electrode or wafer. After the completion of this densification, a second 4,000 Angstrom thick layer 162 (FIG. 2P) of LTO is deposited on the wafer and densified in a similar manner in order to provide an 8,000 angstrom thick layer 164 (FIG. 2Q) of dense, pinhole-free oxide. In our work, we have found that a single 8,000 angstrom thick layer of LTO does not densify as well as the two 4,000 angstroms thick layers with the result that the two layers are preferred. This is particularly true, since pinholes in the two separate layers are not likely to be aligned with each other.

Next, the upper surface of the wafer is coated with a layer of photoresist which is patterned to provide a contact hole over the layer 158 of titanium silicide disposed on the source and body regions. The wafer is then reactive ion etched in a gas mixture of CHF$_3$ and argon in order to provide a selective preference for etching SiO$_2$ as compared to TiSi$_2$. This process normally results in a loss of about 400 angstroms of titanium silicide at the bottom of the contact window 180.

This leaves a titanium silicide layer of 1,600 angstroms, which is sufficient for proper device operation. The device at the end of this etching is shown in FIG. 2Q. Wet hydrogen fluoride etching is not used to open the contact window because hydrogen fluoride etches titanium silicide even faster than it etches SiO$_2$ and it is desired to maintain as much of the titanium silicide at the bottom of the window 180 as possible.

Immediately upon removing the wafer from the reactive ion etching chamber, a layer of titanium oxide (TiO) forms over the exposed titanium silicide due to a reaction with the oxygen in the air. In order to provide a low resistance ohmic contact between the titanium silicide and the subsequently deposited metallization, the wafer is placed in a sputtering chamber and is sputter etched using argon ion bombardment for a period of about 10 minutes to remove 300-400 angstroms uniformly across the wafer surface. This removes all of the titanium oxide in the contact window 180. Thereafter, without breaking the vacuum in the sputtering chamber, a 1000 angstrom layer of a barrier metal such as TiW is sputtered on the wafer. This material prevents aluminum spiking which can otherwise result from the subsequent deposition or sintering of an aluminum metallization layer over the wafer. Further, it minimizes contact electromigration of the aluminum metallization. An aluminum metallization layer is then sputtered onto the wafer surface, preferably in the same sputtering chamber, but in a different sputtering chamber, if desired. An aluminum thickness of about 3 microns is preferred. The aluminum may be pure aluminum or an aluminum silicon alloy as is well known in the art. At the end of the aluminum sputtering step, the wafer appears as shown in FIG. 1.

The drain metallization 136 shown in FIG. 1 may be applied in the same manner and at the same time as the source metallization or separately as may be desired. Metallization contact to the gate electrode is provided in the usual manner at the periphery of the device active area and is not shown in the figures. At the completion of the device fabrication process, the wafer is diced into individual devices if multiple devices have been fabricated. Naturally, if a whole wafer device has been fabricated or the fabricated devices are to be used in their wafer form, the wafer is not diced.

It will be understood, that other dielectrics and etchants than those described may be utilized provided they provide the desired effects at each stage in the process and during device operation.

It will be noted that, (1) the outer boundary of the body region 118, (2) the surface intercept of the heavily doped portion 119, (3) the inner and (4) outer boundaries of the source region 120 and (5) the titanium silicide layer 158 are all self-aligned with respect to the edge of the aperture 170 in the gate electrode. Consequently, the boundaries of each of these regions is the same shape as the edge of the gate aperture 170 and is concentric with that aperture. The self-alignment of the titanium silicide layer 158 result from the use of the thin spacers. The self-alignment of the surface intercept of the heavily doped body portion 119 and the inner boundary of the source region result from the use of the self-aligned thick oxide 186 to mask the source region implant.

The self-alignment of the outer boundaries of the body region 118 and the source region 120 result from the use of the gate electrode as their mask.

The self-alignment of the outer boundary of the heavily doped portion of the body region and the (temporary) thick oxide 186 result from the use of the thick spacers. It will be recognized that even though the titanium silicide layer 158 and the surface intercept of the heavily doped portion of the body region are self-aligned with the aperture in the gate electrode, they are spaced from the edges of the gate electrode because of the thickness of the spacers.

The contact window 180 need not be centered within the window 178 so long as it does not encroach so close to the edge of the spacer as to adversely effect the device operating characteristics. Left and right limits on the position of the contact window 180 are illustrated in FIG. 2Q. It will be recognized, that the location of the limits for the window 180 depend on the thickness of the spacer and other characteristics of the device structure.

While the embodiment which has been described relies on selective reaction of titanium (Ti) with silicon, cobalt is an alternative metal which may be used in this process. As a further alternative, selective deposition of tungsten (W) or molybdenum (Mo) may be used instead of the selective reaction. Selective deposition of a silicide forming metal obviates the need for the two stage silicide process with the intervening etch, since no silicide forming metal is disposed on the spacer. As a further alternative, a selectively depositable metal which does not form a silicide may be used if it is compatible with the subsequent processing steps.

While a preferred process has been described, there are many variations which can be made in the process without departing from the invention. In the basic process which has been described, the thin oxide layer 180 may be removed in the window 184 at the end of the reactive ion etching of the silicon nitride layer. However, that is not preferred, at least in the already described self-aligned source region process since an oxide layer would just be regrown in that location.

Another alternative which deviates more from the already described process is to substitute a deposited silicon oxide layer for the deposited silicon nitride layer. Doing this makes several changes in the process. First, there is no need to grow the thin thermal oxide layer 180 prior to depositing the silicon oxide layer. That silicon oxide layer is preferably a high temperature oxide which is preferably deposited at a temperature in the vicinity of 900° by the decomposition of dichlorosilane by nitrous oxide. That process produces a conformal oxide layer. That oxide layer is then anisotropically etched by reactive ion etching in a gas mixture consisting of trifluoromethane (CHF$_3$) and argon (Ar) in a manner which is already been described with the later HTO thin oxide layer. This etching results in the same window 184 as was obtained with the silicon nitride process. The P-type dopant for the P+ region 119 is then introduced through the window 184. The remaining (spacer) portions of that thick oxide layer are now removed in a wet etching process. Next, the wafer is coated with a layer of photoresist which is patterned to leave a central segment 172 of the photoresist centered in the window 170 as shown in FIG. 3. Because the location of this photoresist pattern is controlled by a mask, the segment 172 may in fact be displaced somewhat from the center of the window 170. Minor displacements of the photoresist 172 from the center of the window 170 do not have a significant effect on device operation where the selective silicide process of the already described preferred process is employed to insure that contact is made between the metallization 134 and both source regions 120 and the P+ portion 119 of the body region. The presence of a photoresist segment 172 converts the window 170 into a smaller apertured window 174. While the portions of the window 174 on opposite sides of the photoresist segment 172 are not connected in the segment of the structure shown in FIG. 3, these are preferably connected at the ends of the window 170 and may also be connected at other points within the window 170 as may be considered desirable.

Next, a heavy concentration of an N-type dopant is implanted through the window 174 into the surface of the semiconductor body and also into the surface of the polycrystalline silicon 132. Thereafter, the photoresist is stripped from the wafer and the wafer is heated to drive the diffusions of the heavily doped portion 119 of the body region and the source regions 120 into the semiconductor body 110. At the end of this step, the structure would appear as is shown in FIG. 2K other than the fact that the surface intercept of the heavily doped portion 119 of the body region may not be centered within the window 170 since a non self-aligned process was used in positioning the heavy doping implant for the source regions 120.

Other variations in the fabrication process may be used as desired.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of fabricating a multi-cellular, silicon field effect power semiconductor device comprising the steps of:
   (a) providing a silicon semiconductor wafer having a first major surface, a first region of said wafer adjacent to said first major surface being doped to one type conductivity;
   (b) forming an insulated gate electrode on said first surface, said insulated gate electrode having a plurality of apertures therein, said apertures comprising a first window;
   (c) forming an opposite type conductivity doped second region in said first region of said semiconductor wafer in self-alignment with said first window;
   (d) forming a wide, self-aligned spacer within said first window along the boundary of said aperture to form a smaller second window within said first window in self-alignment with said first window;
   (e) forming a heavily opposite-type-conductivity-doped portion of said second region in said second region in self-alignment with said second window;
   (f) selectively forming a masking layer in said second window;
   (g) removing the wide spacer without removing said masking layer to form a third, annular window;
   (h) forming a one-type-conductivity-doped third region in said second region beneath and in self-alignment with said third window;
   (i) removing said masking layer;
   (j) forming a narrower, self aligned spacer within said first window along the boundary of said first window to form fourth and fifth windows respectively over the polysilicon and the surface of said wafer;
   (k) forming spaced apart, self-aligned high conductivity layers on and in ohmic contact with said polysilicon within said fourth window and said wafer surface within said fifth window, said high conductivity layers being selected from the group consisting of metals and metal silicides;
   (l) providing a dielectric layer over said wafer, said dielectric layer having contact apertures therein;
   (m) forming metallization over said dielectric layer in ohmic contact with said high conductivity layer within said contact aperture.

2. A method of fabricating a multi-cellular, silicon field effect power semiconductor device comprising the steps of:
   (a) providing a silicon semiconductor wafer having a first major surface, a first region of said wafer adjacent to said first major surface being doped to one type conductivity;
   (b) oxidizing said first major surface of said wafer to form an oxide layer thereon;
   (c) forming a gate electrode layer of polysilicon on said oxide layer;
   (d) patterning said gate polysilicon layer to provide an aperture therein as a first window;
   (e) forming an opposite type conductivity doped second region in said first region of said semiconductor wafer in self-alignment with said first window;
   (f) forming a thick conformal dielectric layer over said wafer;
   (g) anisotropically etching said thick conformal dielectric layer to remove said thick conformal dielectric layer from planar portions of the wafer surface while leaving the thick conformal layer at steps between planar portions of said wafer surface to serve as a spacer and to create a second, smaller window within and self-aligned with respect to said first window;
   (h) forming a heavily opposite-type-conductivity-doped portion of said second region in said second region in self-alignment with said second window;
   (i) selectively forming a masking layer in said second window;
   (j) removing the remaining portions of said thick dielectric layer to form a third, annular window;
   (k) forming a one-type-conductivity-doped third region in said second region beneath and in self-alignment with said third window;
   (l) removing said masking layer to reopen said first window;
   (m) forming a thinner conformal dielectric layer over said wafer;
   (n) anisotropically etching said thinner conformal dielectric layer to remove said thinner conformal dielectric layer from planar portions of said wafer surface while leaving said thinner conformal dielectric layer at steps between planar portions of said wafer surface to serve as a dielectric spacer and to create fourth and fifth windows respectively exposing the polysilicon and the surface of said wafer and separated by said spacer;

(o) forming spaced apart, self-aligned high conductivity layers on and in ohmic contact with said polysilicon within said fourth window and said wafer surface within said fifth window, said high conductivity layers being selected from the group consisting of metals and metal silicides;

(p) providing a dielectric layer over said wafer;

(q) defining a contact window in said dielectric layer within said aperture in said gate electrode; and (r) depositing a metallization layer over said wafer and in said contact window in a manner to form an ohmic contact between said metallization and said high conductivity layer within said contact aperture.

3. A method of fabricating a multi-cellular, silicon field effect power semiconductor device comprising the steps of:

(a) providing a silicon semiconductor wafer having a first major surface, a first region of said wafer adjacent to said first major surface being doped to one type conductivity;

(b) oxidizing said first major surface of said wafer to form an oxide layer thereon;

(c) forming a gate electrode layer of polysilicon on said oxide layer;

(d) patterning said gate polysilicon layer to provide an aperture therein as a first window;

(e) forming an opposite type conductivity doped second region in said first region of said semiconductor wafer in self-alignment with said first window;

(f) forming a thick conformal dielectric layer over said wafer;

(g) anisotropically etching said thick conformal dielectric layer to remove said thick conformal dielectric layer from planar portions of the wafer surface while leaving the thick conformal layer at steps between planar portions of said wafer surface to serve as a spacer and to create a second, smaller window within and self-aligned with respect to said first window;

(h) forming a heavily opposite-type-conductivity-doped portion of said second region in said second region in self-alignment with said second window;

(i) removing the remaining portions of said thick dielectric layer to reopen said first window;

(j) masking a central portion of said first window to form an annular third window;

(k) forming a one-type-conductivity-doped third region in said second region beneath and in self-alignment with said third window;

(l) removing said masking layer to reopen said first window;

(m) forming a thinner conformal dielectric layer over said wafer;

(n) anisotropically etching said thinner conformal dielectric layer to remove said thinner conformal dielectric layer from planar portions of said wafer surface while leaving said thinner conformal dielectric layer at steps between planar portions of said wafer surface to serve as a dielectric spacer and to create fourth and fifth windows respectively exposing the polysilicon and the surface of said wafer and separated by said spacer;

(o) forming spaced apart, self-aligned high conductivity layers on and in ohmic contact with said polysilicon within said fourth window and said wafer surface within said fifth window, said high conductivity layers being selected from the group consisting of metals and metal silicides;

(p) providing a dielectric layer over said wafer;

(q) defining a contact window in said dielectric layer within said aperture in said gate electrode; and (r) depositing a metallization layer over said wafer and in said contact window in a manner to form an ohmic contact between said metallization and said high conductivity layer within said contact aperture.

* * * * *